(12) United States Patent
Kubota et al.

(10) Patent No.: US 10,711,373 B2
(45) Date of Patent: Jul. 14, 2020

(54) SIC COMPOSITE SUBSTRATE AND METHOD FOR MANUFACTURING SAME

(71) Applicants: SHIN-ETSU CHEMICAL CO., LTD., Tokyo (JP); CUSIC INC., Sendai-shi, Miyagi (JP)

(72) Inventors: Yoshihiro Kubota, Annaka (JP); Shoji Akiyama, Annaka (JP); Hiroyuki Nagasawa, Sendai (JP)

(73) Assignees: SHIN-ETSU CHEMICAL CO., LTD., Tokyo (JP); CUSIC INC., Sendai-shi (JP)

( * ) Notice: Subject to any disclaimer, the term of this patent is extended or adjusted under 35 U.S.C. 154(b) by 54 days.

(21) Appl. No.: 15/759,376

(22) PCT Filed: Sep. 8, 2016

(86) PCT No.: PCT/JP2016/076361
§ 371 (c)(1),
(2) Date: Mar. 12, 2018

(87) PCT Pub. No.: WO2017/047478
PCT Pub. Date: Mar. 23, 2017

(65) Prior Publication Data
US 2018/0251911 A1 Sep. 6, 2018

(30) Foreign Application Priority Data

Sep. 14, 2015 (JP) .................................. 2015-180637

(51) Int. Cl.
*C23C 16/42* (2006.01)
*C30B 33/06* (2006.01)
(Continued)

(52) U.S. Cl.
CPC ............... *C30B 33/06* (2013.01); *C23C 16/01* (2013.01); *C23C 16/325* (2013.01); *C23C 16/42* (2013.01);
(Continued)

(58) Field of Classification Search
USPC .............. 428/698; 427/248.1, 249.1, 249.15, 427/249.16
See application file for complete search history.

(56) References Cited

U.S. PATENT DOCUMENTS 6,053,973 A 4/2000 Tanino et al.
6,153,166 A 11/2000 Tanino
(Continued)

FOREIGN PATENT DOCUMENTS

JP   H10-223496 A   8/1998
JP   10-335617 A    12/1998
(Continued)

OTHER PUBLICATIONS

Aida et al. "Reduction of Bowing in GaN-on-Sapphire and GaN-on-Silicon Substrates by Stress Implantation by Internally Focused Laser Processing", Japan Journal of Applied Physic, (2012), 016504, vol. 51, (Cited in Specification), (7 pages).
(Continued)

*Primary Examiner* — Archene A Turner
(74) *Attorney, Agent, or Firm* — Westerman, Hattori, Daniels & Adrian, LLP

(57) ABSTRACT

Provided is an SiC composite substrate 10 having a monocrystalline SiC layer 12 on a polycrystalline SiC substrate 11, wherein: some or all of the interface at which the polycrystalline SiC substrate 11 and the monocrystalline SiC layer 12 are in contact is an unmatched interface $I_{12/11}$ that is not lattice-matched; the monocrystalline SiC layer 12 has a smooth obverse surface and has, on the side of the interface
(Continued)

with the polycrystalline SiC substrate 11, a surface that has more pronounced depressions and projections than the obverse surface; and the close-packed plane (lattice plane 11p) of the crystals of the polycrystalline SiC in the polycrystalline SiC substrate 11 is randomly oriented with reference to the direction of a normal to the obverse surface of the monocrystalline SiC layer 12. The present invention improves the adhesion between the polycrystalline SiC substrate and the monocrystalline SiC layer.

8 Claims, 8 Drawing Sheets

(51) Int. Cl.
H01L 21/265 (2006.01)
H01L 21/02 (2006.01)
H01L 21/762 (2006.01)
H01L 21/304 (2006.01)
H01L 21/18 (2006.01)
C23C 16/01 (2006.01)
C23C 16/32 (2006.01)
C30B 25/18 (2006.01)
C30B 29/36 (2006.01)
H01L 29/06 (2006.01)
H01L 29/16 (2006.01)

(52) U.S. Cl.
CPC ............ *C30B 25/18* (2013.01); *C30B 29/36* (2013.01); *H01L 21/02002* (2013.01); *H01L 21/0262* (2013.01); *H01L 21/02378* (2013.01); *H01L 21/02447* (2013.01); *H01L 21/02513* (2013.01); *H01L 21/02529* (2013.01); *H01L 21/02595* (2013.01); *H01L 21/02598* (2013.01); *H01L 21/02634* (2013.01); *H01L 21/02658* (2013.01); *H01L 21/185* (2013.01); *H01L 21/265* (2013.01); *H01L 21/304* (2013.01); *H01L 21/76254* (2013.01); *H01L 29/06* (2013.01); *H01L 29/1608* (2013.01)

(56) References Cited

U.S. PATENT DOCUMENTS

| 6,251,754 | B1 | 6/2001 | Ohshima et al. |
| 6,964,914 | B2 | 11/2005 | Ghyselen et al. |
| 2003/0219959 | A1 | 11/2003 | Ghyselen et al. |
| 2008/0121910 | A1* | 5/2008 | Bergmann ........ H01L 21/02378 257/98 |
| 2016/0204023 | A1 | 7/2016 | Imaoka et al. |

FOREIGN PATENT DOCUMENTS

| JP | 11-147794 A | | 6/1999 |
| JP | 2004-519093 A | | 6/2004 |
| JP | 2009-218575 | * | 9/2009 |
| JP | 2010-135552 | * | 6/2010 |
| JP | 5051962 B2 | | 10/2012 |
| JP | 2014-11301 A | | 1/2014 |
| JP | 2014-22711 A | | 2/2014 |
| JP | 2014-216555 A | | 11/2014 |
| JP | 2015-15401 A | | 1/2015 |
| WO | 99/00538 A1 | | 1/1999 |
| WO | 2015/097852 A1 | | 7/2015 |

OTHER PUBLICATIONS

International Search Report dated Dec. 13, 2016, issued in Counterpart of International Application No. PCT/JP2016/076361 (2 pages).

Office Action dated Mar. 17, 2020, issued in counterpart JP Application No. 2019-088763, with English translation (4 pages).

* cited by examiner

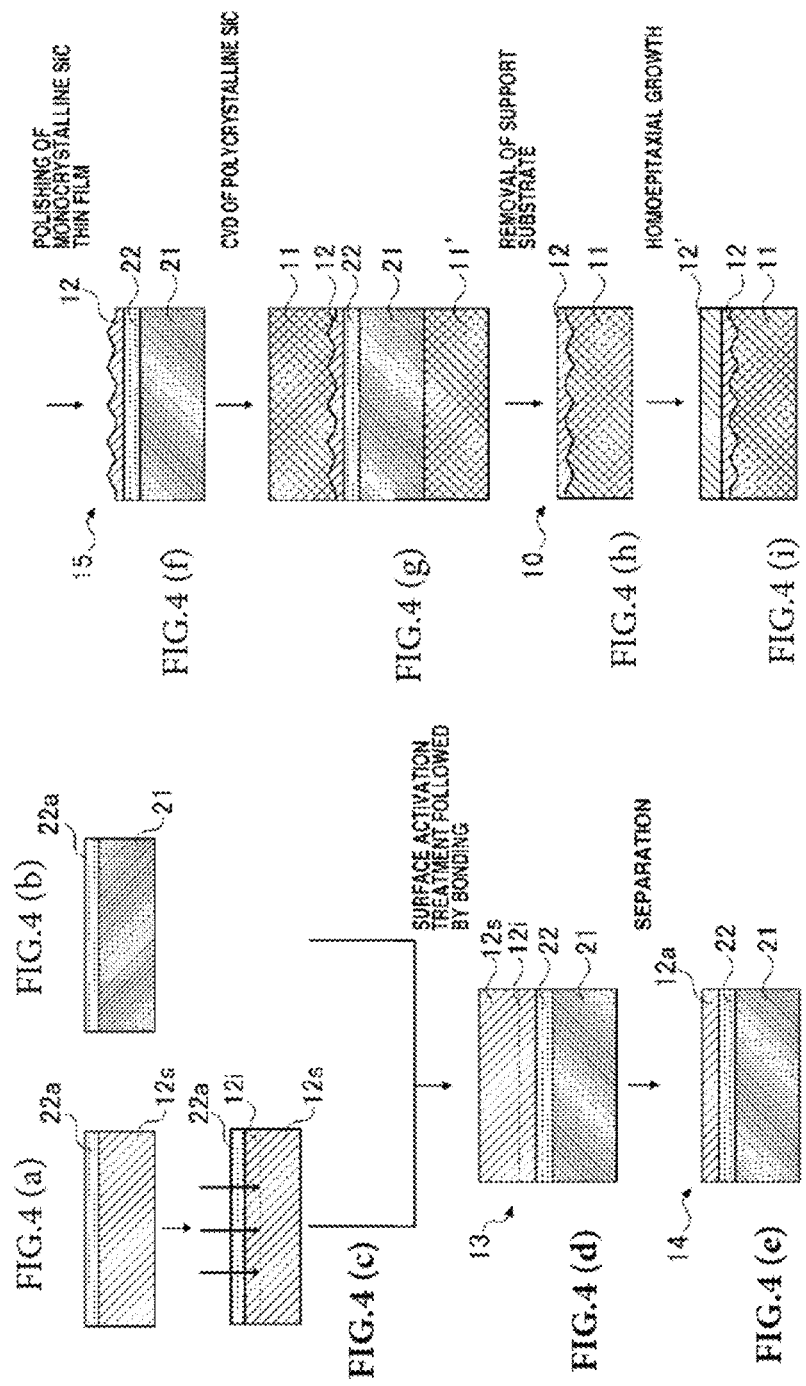

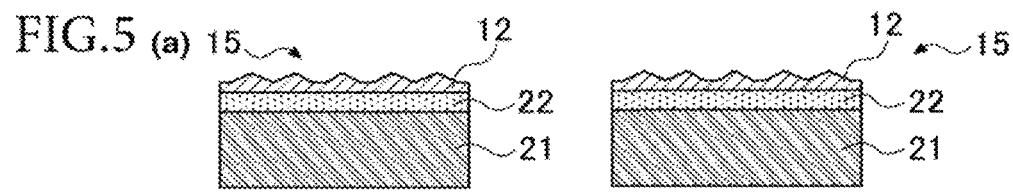
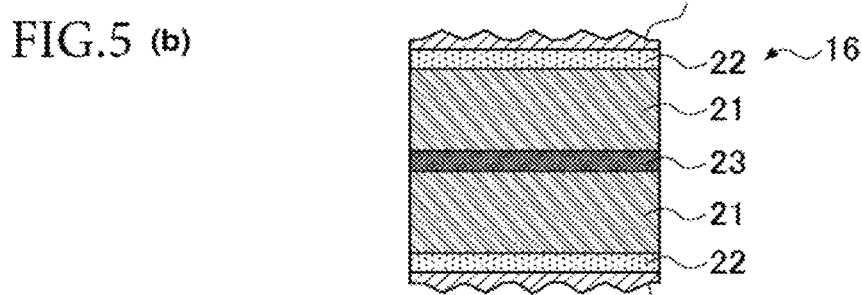
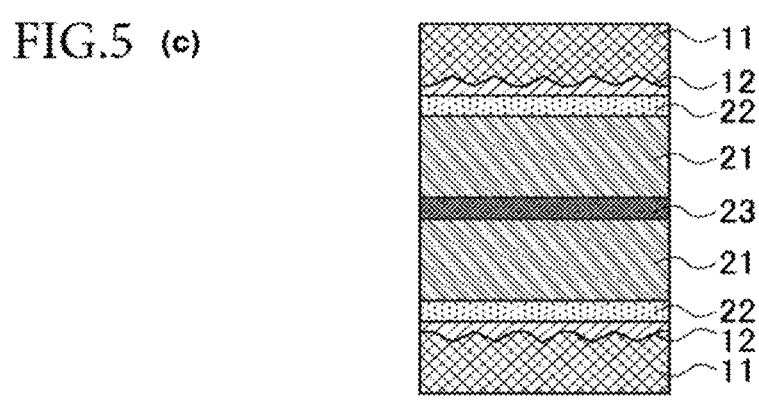
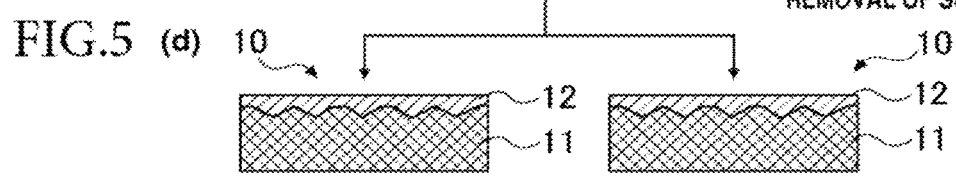
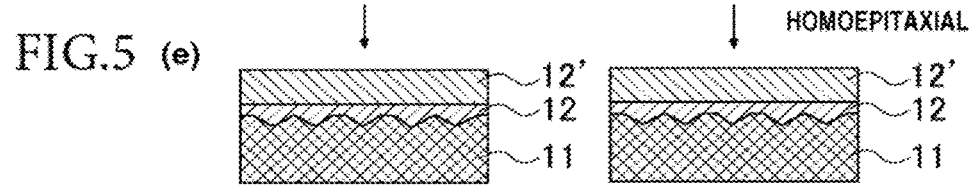

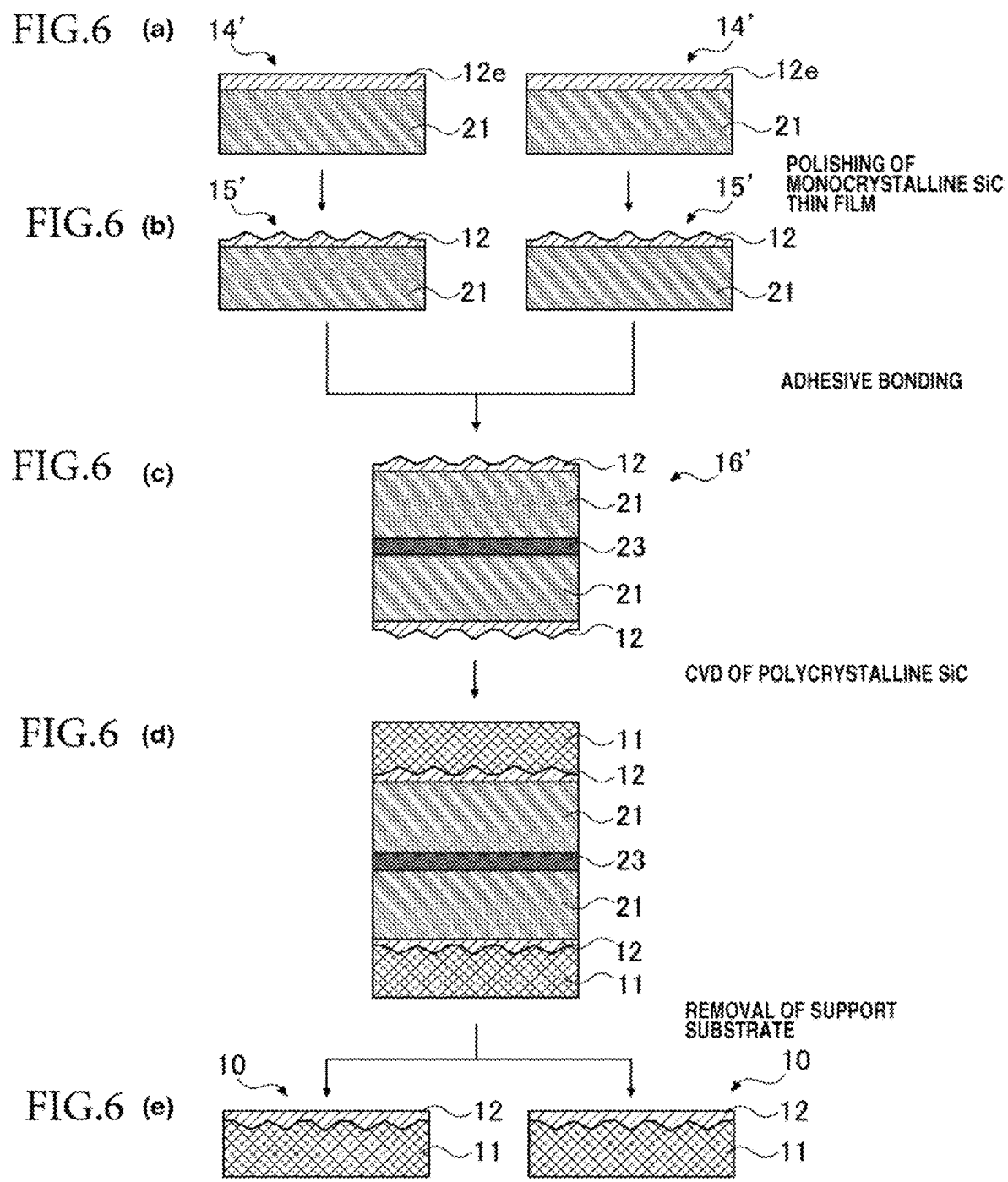

FIG.7
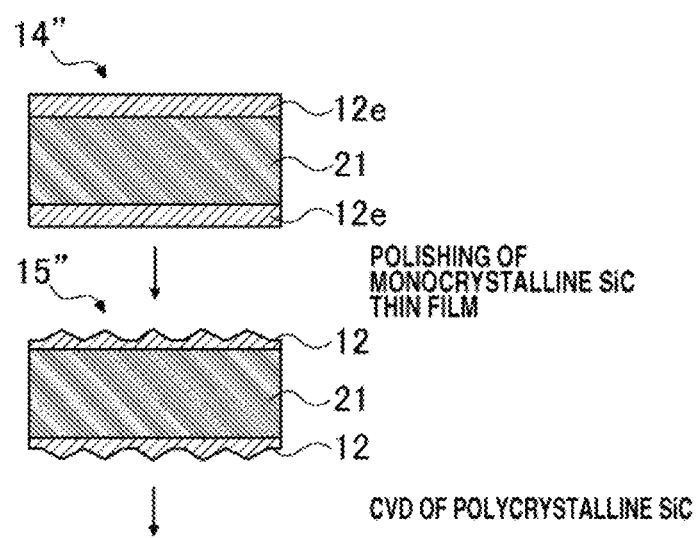
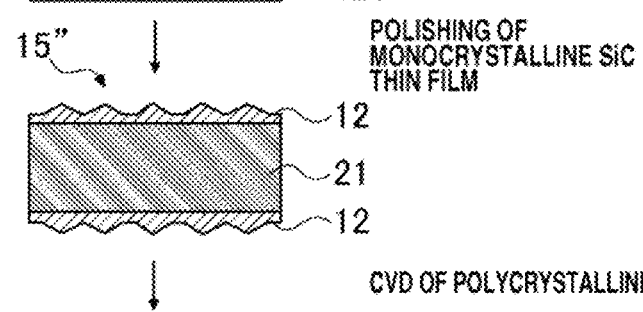
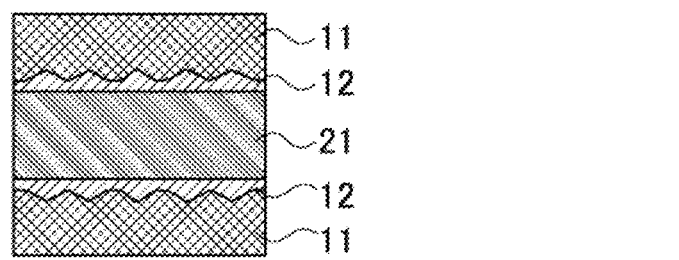
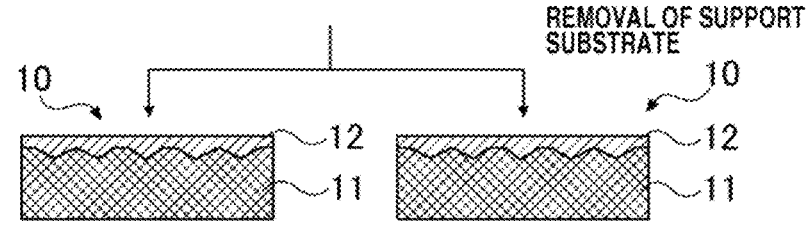

FIG.10
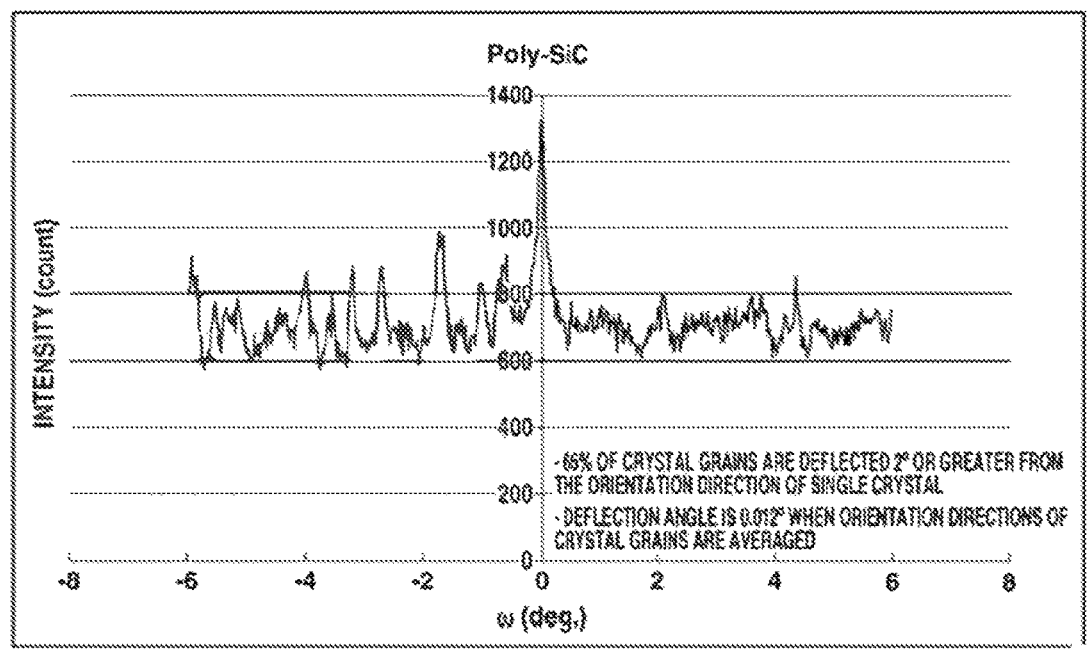
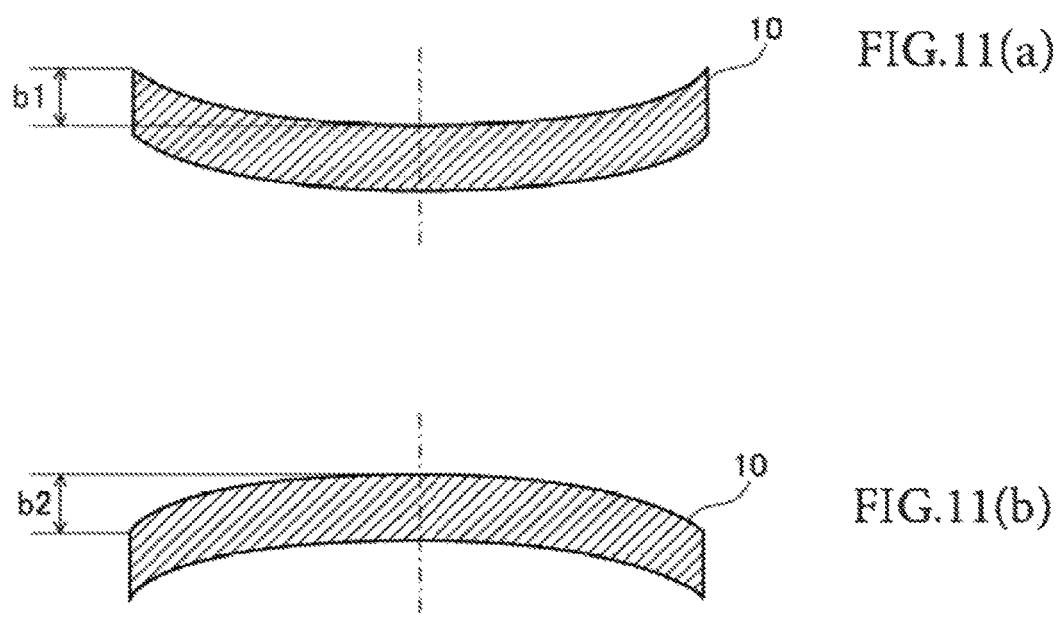
FIG.11(a)
FIG.11(b)

SIC COMPOSITE SUBSTRATE AND METHOD FOR MANUFACTURING SAME

TECHNICAL FIELD

This invention relates to an SiC composite substrate comprising a polycrystalline SiC substrate and a monocrystalline SiC layer thereon, for use in the fabrication of semiconductor devices such as Schottky barrier diodes, pn diodes, pin diodes, field effect transistors (FETs), and insulated gate bipolar transistors (IGBTs) intended for power control at high temperature, high frequency and high power, and the growth of gallium nitride, diamond and nano-carbon thin film, and a method for manufacturing the SiC composite substrate. More particularly, it relates to a composite substrate of large diameter size experiencing no shape changes caused by stresses and having a monocrystalline SiC surface with a low defect density, and a method for manufacturing the same.

BACKGROUND ART

In the prior art, monocrystalline silicon substrates are widely used as the semiconductor substrate. Because of their physical limits, they gradually cease from meeting such requirements as higher operating temperature, improved pressure resistance, and higher frequency, and engineers start using expensive substrates of new materials such as monocrystalline SiC substrates and monocrystalline GaN substrates. For example, when power converters such as inverters and AC/DC converters are constructed from semiconductor devices using silicon carbide (SiC) which is a semiconductor material having a wider forbidden band than silicon (Si), they achieve a reduction of power loss which is not reachable by semiconductor devices using silicon. Using semiconductor devices based on SiC, not only the loss associated with power conversion is made smaller than in the prior art, but also the modification of devices toward lighter weight, compact size and higher reliability is promoted.

Such monocrystalline SiC substrates are generally prepared by the method (improved Rayleigh method) involving letting high-purity SiC powder sublimate at a high temperature of 2,000° C. or higher and re-growing SiC on a spaced-apart seed crystal. However, since the steps involved in this preparation method are quite complex and under very rigorous conditions, the resulting substrates are inevitably reduced in quality and yield, that is, the substrates become of very high cost, which prohibits their practical application and utilization in a wide range.

Meanwhile, the thickness of a layer (active layer) which develops a device function actually on these substrates is in a range of 0.5 to 100 μm in any of the above-mentioned applications, whereas the remaining thickness portion is a portion that mainly plays the role of mechanical support for handling, that is, a so-called handle member (substrate) which is not limited in defect density or the like.

Thus, a recent study is made on substrates of the structure that a relatively thin monocrystalline SiC layer having the minimum thickness is bonded to a polycrystalline SiC substrate via a layer of a ceramic such as $SiO_2$, $Al_2O_3$, $Zr_2O_3$, $Si_3N_4$ or AlN or a metal such as Si, Ti, Ni, Cu, Au, Ag, Co, Zr, Mo or W. However, they are impractical. In the former (ceramic) case, the interposing layer for bonding the monocrystalline SiC layer to the polycrystalline SiC substrate is an insulator and electric conduction on the back surface is unavailable upon device fabrication. In the latter (metal) case, metal impurity is incidentally entrained into the device, causing degradations of device performance and reliability.

Under the circumstances, many proposals have hitherto been made to overcome these shortcomings. For example, JP 5051962 (Patent Document 1) discloses a method involving the steps of providing a source substrate in the form of a monocrystalline SiC substrate having a silicon oxide thin film in which hydrogen or similar ions are implanted, providing an intermediate support of polycrystalline aluminum nitride having silicon oxide deposited on its surface, bonding the source substrate and the intermediate support at their silicon oxide surfaces, transferring the monocrystalline SiC thin film to the polycrystalline aluminum nitride (intermediate support), then depositing polycrystalline SiC, and thereafter immersing in a HF bath to dissolve the silicon oxide surface for division. However, when an SiC composite substrate of large diameter is prepared by this method, there arises the problem that a substantial bowing occurs due to the difference in coefficient of thermal expansion between the deposited polycrystalline SiC layer and the aluminum nitride (intermediate support). In addition, another problem can arise that the high interfacial energy at the interface between heterogeneous materials causes to form structural defects, which propagate into the monocrystalline SiC layer to increase the defect density.

JP-A 2015-15401 (Patent Document 2) discloses a method for stacking a monocrystalline SiC layer on a polycrystalline SiC support substrate, which is difficult to flatten its surface, without forming an oxidized film at the bonding interface, the method involving the steps of modifying with a high-speed atom beam the surface of the polycrystalline SiC support substrate to be amorphous without forming an oxidized film, and simultaneously modifying the surface of monocrystalline SiC to be amorphous, and bringing them in close contact and thermally bonding them. This method, however, has the shortcoming that since not only the separation interface of monocrystalline SiC, but also the crystal interior are partially modified with the high-speed atom beam, the originally monocrystalline SiC is difficultly restored to monocrystalline SiC of satisfactory quality even by subsequent heat treatment. When monocrystalline SiC of such quality is used as device substrates, templates or the like, devices of better properties or SiC epitaxial films of quality are obtainable with difficulty.

In addition to these shortcomings, the above technology has the problem that in order to bond monocrystalline SiC and a polycrystalline SiC support substrate together, the bonded interface must be as smooth as demonstrated by a surface roughness (arithmetic average roughness Ra according to JIS B0601-2013) of 1 nm or less. Even after monocrystalline SiC surface is modified to be amorphous, SiC which is known as difficult-to-machine material next to diamond takes a very long time in the subsequent smoothening process such as by grinding, polishing or chemical mechanical polishing (CMP). Thus a cost increase is unavoidable, which becomes a substantial barrier against practical application.

Further, the monocrystalline SiC layer undergoes a volume change at the time of crystallinity recovery, which induces expansion of internal stresses and defects (dislocations) occurring from polycrystalline/monocrystalline interface, and gives rise to the problem that the amount of bowing increases as the substrate becomes of larger diameter. When the modified stratum of monocrystalline SiC layer is an amorphous stratum, recrystallization of that stratum entails uniform nucleation, and formation of twins is thus unavoidable. In addition, a problem arises that since the process from ion irradiation to bonding is a continuous process in vacuum, the cost of the system is high. The problem of increased system cost also arises because ion implantation to a deep range (high energy) is necessary depending on the roughness of the substrate.

JP-A 2014-216555 (Patent Document 3) discloses a method involving the steps of bonding a first layer of monocrystalline SiC containing point defects onto a support substrate, and heating the layer along with the support substrate for rearranging the atom arrangement to extinguish point defects and line defects, and shutting off the influence of the crystal face of the support substrate on the overlying layer. However, there is the problem that point defects in the first layer are converted to complex defects during the heat treatment, which invite formation of twins and stacking faults. Another problem is that the substrate manufacture process becomes complicated since multiple stages of ion implantation are necessary in order to distribute point defects in the monocrystalline SiC layer (first layer). A further problem arises that dislocations occur depending on the energy level at the bonded layer interface with the support substrate.

JP-A 2014-22711 (Patent Document 4) discloses a method involving the steps of bonding an SiC layer having a low impurity density and low density defects onto a support substrate having a high impurity density and high density defects, and epitaxially growing thereon a layer having an impurity concentration necessary for a semiconductor device function, for thereby obtaining a low defect density layer equivalent to the low concentration layer. However, there remain outstanding problems that metal contamination occurs at the bonded interface and dislocations propagate from the high density substrate to the front layer side because crystal lattices are continuous from the substrate to the front surface.

JP-A 2014-11301 (Patent Document 5) discloses a method involving the steps of heating a support substrate of SiC to convert its surface to a carbon base layer, bonding a monocrystalline semiconductor layer to the surface, and thereafter causing cleavage over the entire area or in part. However, the method cannot be a means for obtaining a stable substrate because the layer containing SiC and carbon is bonded by fragile valence bonds so that the bonded interface is mechanically weak, and the carbon layer is damaged even in an oxidizing atmosphere.

JP-A H10-335617 (Patent Document 6) discloses a method for obtaining a semiconductor thin film on an insulating film, involving the steps of forming a hydrogen-occluded layer and an amorphous layer on a monocrystalline semiconductor substrate without resorting to ion implantation, bonding the amorphous layer to a support substrate, allowing for solid phase re-growth, and separating the monocrystalline semiconductor substrate. The method, however, has a possibility of twin formation during solid phase growth of the amorphous layer. Besides, there is the problem that the insulating film interposed prohibits the manufacture of substrates for discrete devices adapted for current flow in vertical direction.

The following document is also incorporated by reference as pertaining to the present invention. "Reduction of Bowing in GaN-on-Sapphire and GaN-on-Silicon Substrates by Stress Implantation by Internally Focused Laser Processing," Japan Journal of Applied Physics, Vol. 51 (2012) 016504 (Non-Patent Document 1).

PRIOR ART DOCUMENTS

Patent Documents

Patent Document 1: JP 5051962
Patent Document 2: JP-A 2015-015401
Patent Document 3: JP-A 2014-216555
Patent Document 4: JP-A 2014-022711
Patent Document 5: JP-A 2014-011301
Patent Document 6: JP-A H10-335617
Non-Patent Document 1: "Reduction of Bowing in GaN-on-Sapphire and GaN-on-Silicon Substrates by Stress Implantation by Internally Focused Laser Processing," Japan Journal of Applied Physics, Vol. 51 (2012) 016504

SUMMARY OF INVENTION

Technical Problem

An object of the invention, which has been made under the above-mentioned circumstances, is to provide an SiC composite substrate wherein a polycrystalline SiC substrate and a monocrystalline SiC layer are bonded without any interposing layer and the adhesion between the polycrystalline SiC substrate and the monocrystalline SiC layer is improved without introducing defects into the crystal structure of monocrystalline SiC layer; and a method for manufacturing the same.

Solution to Problem

To attain the above object, the invention provides an SiC composite substrate and a method for manufacturing the same, as defined below.

[1] An SiC composite substrate comprising a polycrystalline SiC substrate and a monocrystalline SiC layer thereon, wherein the entirety or a part of the interface of the polycrystalline SiC substrate in abutment with the monocrystalline SiC layer is a mismatch interface that is not lattice-matched, the monocrystalline SiC layer has a smooth front surface and a more rugged surface on the side of the interface with the polycrystalline SiC substrate than the front surface, and the close-packed planes of polycrystalline SiC crystals in the polycrystalline SiC substrate are randomly oriented with reference to a normal direction to the front surface of the monocrystalline SiC layer.

[2] The SiC composite substrate of [1] wherein the rugged surface that the monocrystalline SiC layer has on the side of the interface with the polycrystalline SiC substrate is composed of oblique surface segments which are randomly oriented with reference to a normal direction to the front surface of the monocrystalline SiC layer.

[3] The SiC composite substrate of [1] or [2] wherein the polycrystalline SiC substrate is a chemical vapor deposition film.

[4] The SiC composite substrate of any one of [1] to [3] wherein the polycrystalline SiC in the polycrystalline SiC substrate is in the form of cubic crystals having the close-packed plane which is {111} plane.

[5] A method for manufacturing an SiC composite substrate comprising a polycrystalline SiC substrate and a monocrystalline SiC layer thereon, comprising the steps of:

forming a monocrystalline SiC thin film on one major surface of a support substrate, mechanically working the surface of the monocrystalline SiC thin film for roughening, and removing defects caused by mechanical working, to form a monocrystalline SiC layer having a surface which is more rugged than the surface of the layer adjacent to the support substrate, the rugged surface being composed of oblique surface segments which are randomly oriented with reference to a normal direction to the surface of the layer adjacent to the support substrate, depositing polycrystalline SiC on the rugged surface of the monocrystalline SiC layer by chemical vapor deposition, thereby forming a polycrystalline SiC substrate wherein the close-packed planes of polycrystalline SiC crystals are randomly oriented with reference to a normal direction to the surface of the monocrystalline SiC layer adjacent to the support substrate, and thereafter physically and/or chemically removing the support substrate.

[6] The method of [5] wherein the step of working the surface of the monocrystalline SiC thin film for roughening includes polishing the surface of the monocrystalline SiC thin film in random directions with diamond abrasive grits.

[7] The method of [5] or [6] wherein the support substrate is formed of polycrystalline or monocrystalline silicon.

[8] The method of any one of [5] to [7] wherein the step of forming a monocrystalline SiC thin film on a support substrate includes separating a monocrystalline SiC thin film from a monocrystalline SiC substrate by the ion implantation separation method and transferring the monocrystalline SiC thin film onto the support substrate.

[9] The method of any one of [5] to [7] wherein the step of forming a monocrystalline SiC thin film on a support substrate includes hetero-epitaxially growing SiC on the support substrate.

[10] The method of any one of [5] to [9] wherein a monocrystalline SiC layer carrier having the monocrystalline SiC layers on both surfaces of the support substrate is prepared, the polycrystalline SiC substrate is formed on the rugged surface of each monocrystalline SiC layer, and thereafter the support substrate is physically and/or chemically removed.

[11] The method of any one of [5] to [9] wherein a monocrystalline SiC layer carrier having the monocrystalline SiC layer only on the front surface of the support substrate is prepared, the polycrystalline SiC substrates are formed on the rugged surface of the monocrystalline SiC layer and the back surface of the support substrate, respectively, and thereafter the support substrate is physically and/or chemically removed.

[12] The method of any one of [5] to [9] wherein two monocrystalline SiC layer carriers are prepared, each carrier having the monocrystalline SiC layer only on the front surface of the support substrate, the back surfaces of the support substrates of the monocrystalline SiC layer carriers are bonded together, the polycrystalline SiC substrates are formed on the rugged surfaces of the monocrystalline SiC layers on the front and back surfaces of the bonded substrate, respectively, then the assembly is divided at the bonded interface between the back surfaces of the support substrates, and simultaneously or subsequently the support substrates are physically and/or chemically removed.

Advantageous Effects of Invention

In the SiC composite substrate of the invention, the interface of the monocrystalline SiC layer in abutment with the polycrystalline SiC substrate is a mismatch interface that is not crystal lattice-matched. There is the tendency that as microscopically viewed, stresses act in a certain direction to reduce the adhesion therebetween. Since the close-packed planes of polycrystalline SiC crystals in the polycrystalline SiC substrate are randomly oriented with reference to a normal direction to the front surface of the monocrystalline SiC layer, a tensile stress and a compressive stress are equally generated to offset each other in any directions at the interface between the monocrystalline SiC layer and the polycrystalline SiC substrate. Thus internal stresses are reduced over the entire interface and the adhesion therebetween is improved. Since the interface between the monocrystalline SiC layer and the polycrystalline SiC substrate is a mismatch interface, dislocations even when occurring within the polycrystalline SiC substrate are prevented from propagating into the monocrystalline SiC layer. Further, the random orientation of the close-packed planes of polycrystalline SiC crystals in the polycrystalline SiC substrate with reference to a normal direction to the front surface of the monocrystalline SiC layer ensures that even when dislocations are induced in the monocrystalline SiC layer in proximity to the interface by localized stresses, they propagate isotropically so that propagating dislocations and stacking faults are mutually terminated whereby a monocrystalline SiC surface with a low defect density is obtainable.

The inventive method for manufacturing an SiC composite substrate involves the steps of mechanically working for surface roughening to form a monocrystalline SiC layer having a rugged surface which is more rugged than the surface of the layer adjacent to the support substrate, the rugged surface being composed of oblique surface segments which are randomly oriented with reference to a normal direction to the surface of the layer adjacent to the support substrate, and depositing polycrystalline SiC on the rugged surface by CVD, thereby forming a polycrystalline SiC substrate wherein the close-packed planes of polycrystalline SiC crystals are randomly oriented with reference to a normal direction to the surface of the monocrystalline SiC layer adjacent to the support substrate. Thus the inventive SiC composite substrate may be manufactured in a simple way.

BRIEF DESCRIPTION OF DRAWINGS

FIGS. 4(a)-4(i) illustrate steps in Embodiment 1 of a method for manufacturing an SiC composite substrate according to the invention.

FIGS. 5(a)-5(e) illustrate steps in Embodiment 2 of a method for manufacturing an SiC composite substrate according to the invention.

FIGS. 6(a)-6(e) illustrate steps in Embodiment 3 of a method for manufacturing an SiC composite substrate according to the invention.

FIGS. 7(a)-7(d) illustrate steps in Embodiment 4 of a method for manufacturing an SiC composite substrate according to the invention.

FIG. 10 is a diagram showing the X-ray rocking curve (ω scan) of a polycrystalline SiC substrate in an composite substrate in Example 1.

FIGS. 11(a)-11(b) are schematic views showing measurement of a bow in an SiC composite substrate.

DESCRIPTION OF EMBODIMENTS

[SiC Composite Substrate]

An SiC composite substrate according the invention is described below.

The invention provides an SiC composite substrate comprising a polycrystalline SiC substrate and a monocrystalline SiC layer thereon, characterized in that the entirety or a part of the interface of the polycrystalline SiC substrate in abutment with the monocrystalline SiC layer is a mismatch interface that is not lattice-matched, the monocrystalline SiC layer has a smooth front surface and a more rugged surface on the side of the interface with the polycrystalline SiC substrate than the front surface, and the close-packed planes of polycrystalline SiC crystals in the polycrystalline SiC substrate are randomly oriented with reference to a normal direction to the front surface of the monocrystalline SiC layer.

Figure 1:
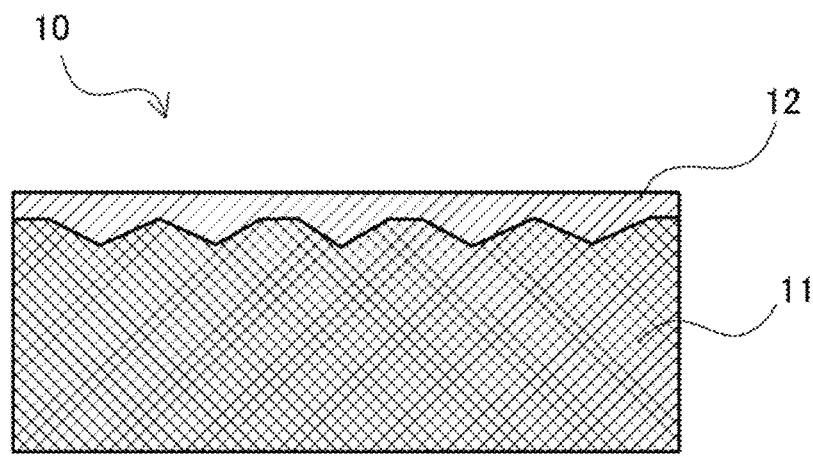
FIG. 1 is a cross-sectional view showing the overall construction of an SiC composite substrate according to the invention.
Figure 2:
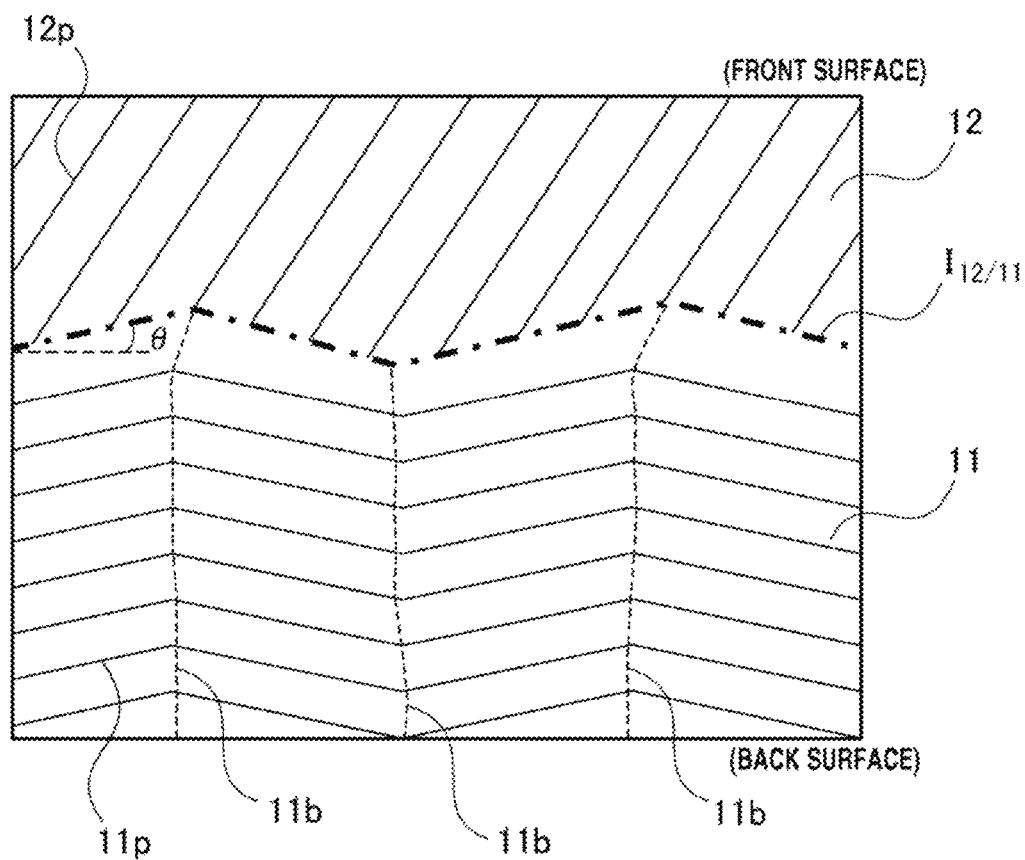
FIG. 2 is a schematic view showing the microscopic structure at the interface between a monocrystalline SiC layer and a polycrystalline SiC substrate of the SiC composite substrate according to the invention.

FIGS. 1 and 2 illustrate the construction of an SiC composite substrate according to the invention. FIG. 1 is a cross-sectional view showing the overall construction (macroscopic structure) of the SiC composite substrate. FIG. 2 is a schematic view showing the microscopic structure at the interface between a monocrystalline SiC layer and a polycrystalline SiC substrate.

As seen from FIG. 1, the SiC composite substrate 10 of the invention comprises a polycrystalline SiC substrate 11 and a monocrystalline SiC layer 12 formed on the SiC substrate 11.

Herein, the close-packed planes of polycrystalline SiC crystals in polycrystalline SiC substrate 11 are randomly oriented with reference to a normal direction to the front surface of monocrystalline SiC layer 12.

It is noted that random orientation means that the close-packed planes of polycrystalline SiC crystals are faced equally in all directions rather than faced biasedly in a certain direction, as viewed in the overall polycrystalline SiC substrate 11, with reference to a normal direction to the front surface of monocrystalline SiC layer 12.

The polycrystalline SiC substrate 11 has a thickness which is preferably 100 to 650 μm in consideration of strength as handle substrate, and more preferably 200 to 350 μm in additional consideration of series resistance on use as a vertical type device. A thickness of at least 100 μm is more likely to provide a handle substrate function whereas a thickness of up to 650 μm may achieve reductions of cost and electrical resistance.

The polycrystalline SiC substrate 11 is preferably a film resulting from deposition of polycrystalline SiC by the chemical vapor deposition (CVD) method, that is, CVD film. Namely, the polycrystalline SiC substrate 11 is preferably deposited parallel to the raised/depressed oblique planes on the surface of the monocrystalline SiC layer 12 such that the close-packed planes of crystal grains are oriented in random directions (as will be described later).

The polycrystalline SiC substrate 11 is composed of crystals having a grain size desirably between 0.1 μm and 30 more desirably between 0.5 μm and 10 μm. A crystal grain size of up to 30 μm makes it easy to reduce the area of the interface between a certain SiC crystal grain and the monocrystalline SiC layer 12, to suppress the localization of stress at the interface, and eventually to suppress plastic deformation of crystal lattices and to suppress motion of dislocations and hence, to maintain the quality of monocrystalline SiC layer 12 high. A crystal grain size of at least 0.1 μm makes it easy to increase the mechanical strength of polycrystalline SiC substrate 11 as handle substrate and to reduce the resistivity thereof for helping the polycrystalline SiC substrate 11 function as a semiconductor substrate.

Also preferably, the polycrystalline SiC in polycrystalline SiC substrate 11 is in the form of cubic crystals having the close-packed plane which is more preferably {111} plane. The cubic SiC is isotropic crystals and have equivalent 4 close-packed planes, which avoids that a certain close-packed plane is oriented in a particular direction and further ensures to exert the effect of reducing stress at the interface between polycrystalline SiC substrate 11 and monocrystalline SiC layer 12 and the effect of reducing the bow of SiC composite substrate 10. In addition, the cubic SiC is the lowest temperature phase among polycrystalline SiC and can be formed even at temperatures not higher than the melting point of Si, with the advantage that the freedom of choice of material for the support substrate to be described later is increased.

It is noted that the resistivity of polycrystalline SiC substrate 11 may be adjusted by introducing an impurity therein. This adjustment allows the substrate to be advantageously used as a substrate for vertical power semiconductor devices.

Further, the polycrystalline SiC substrate 11 is composed of the same SiC as the overlying monocrystalline SiC layer 12, which means that monocrystalline SiC layer 12 and polycrystalline SiC substrate 11 have an equal coefficient of thermal expansion. This reduces the bowing of SiC composite substrate 10 at any temperatures.

As long as the monocrystalline SiC layer 12 is composed of monocrystalline SiC, its crystalline structure may be any of 4H—SiC, 6H—SiC, and 3C—SiC.

The monocrystalline SiC layer 12 is preferably obtained by separating a thin film or layer from a bulk form of monocrystalline SiC, for example, a monocrystalline SiC substrate of 4H—SiC, 6H—SiC or 3C—SiC crystalline structure as will be described later. Alternatively, the monocrystalline SiC layer 12 may be a film which is heteroepitaxially grown by the vapor deposition method as will be described later.

Also, the monocrystalline SiC layer 12 is a thin film of monocrystalline SiC having a thickness of up to 1 μm, preferably from 100 nm to 1 μm, more preferably from 200 nm to 800 nm, and even more preferably from 300 nm to 500 nm.

When the monocrystalline SiC layer 12 is formed by the ion implantation separation method, its thickness is determined by the range of implanting ions (depth of ion implantation), with its upper limit being around 1 μm. Notably, when it is desired to use the monocrystalline SiC layer 12 as the active layer of a power device, a thickness of at least 10 μm is required in some cases. In such cases, an SiC epitaxial layer 12' may be homoepitaxially grown on the monocrystalline SiC layer 12 until a monocrystalline SiC layer of the desired thickness is formed.

The monocrystalline SiC layer 12 has a rugged surface on the side of its interface with polycrystalline SiC substrate 11, the rugged surface consisting of oblique surface segments which are preferably oriented in random directions with reference to a normal direction to the front surface of monocrystalline SiC layer 12. The surface ruggedness will be described later in Embodiments of the method for manufacturing an SiC composite substrate.

FIG. 2 is a schematic view showing the microscopic structure at the interface between monocrystalline SiC layer 12 and polycrystalline SiC substrate 11 of SiC composite substrate 10 according to the invention. Illustrated are lattice planes 11p of crystals of which polycrystalline SiC substrate 11 is composed, grain boundaries 11b, and lattice planes 12p of single crystals of which monocrystalline SiC layer 12 is composed. While SiC composite substrate 10 has a structure in which monocrystalline SiC layer 12 is in abutment with polycrystalline SiC substrate 11, the entirety or a part of the interface between polycrystalline SiC substrate 11 and monocrystalline SiC layer 12 is a mismatch interface $I_{12/11}$ that is not crystal lattice-matched.

In FIG. 2, the polycrystalline SiC substrate 11 has the structure that crystals of which polycrystalline SiC substrate 11 is composed are deposited such that for each of oblique surface segments constituting undulation of the surface of monocrystalline SiC layer 12 on the side of its interface with polycrystalline SiC substrate 11 (i.e., mismatch interface $I_{12/11}$), the close-packed planes (lattice planes 11p) of crystals are parallel to the oblique surface segment.

Figure 3:
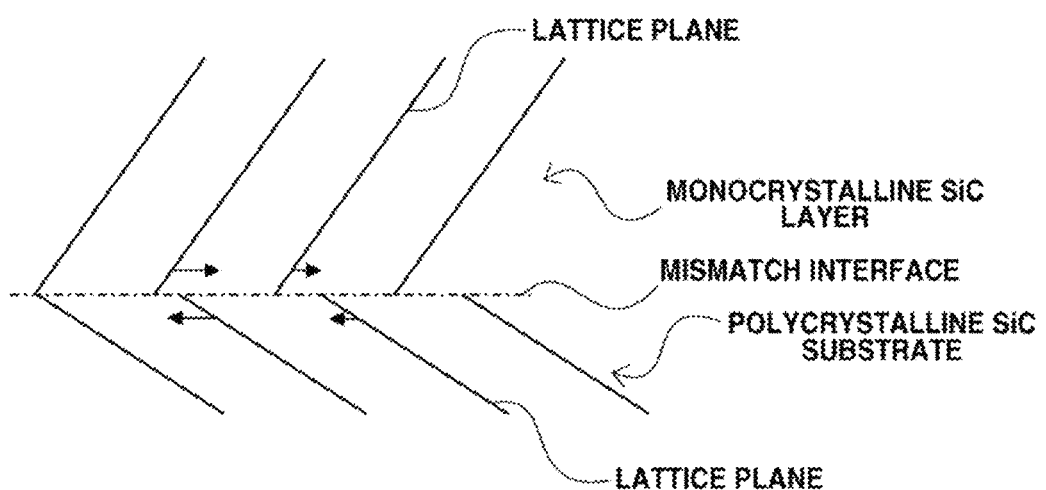
FIG. 3 is a schematic view showing the microscopic structure at the interface between a monocrystalline SiC layer and a polycrystalline SiC substrate of a prior art SiC composite substrate.

In a prior art structure having a monocrystalline SiC layer in abutment with a polycrystalline SiC substrate, discontinuity in crystal lattice occurs at the mismatch interface due to differences in lattice spacing and lattice plane orientation direction (see FIG. 3). Since the atom (Si or C) positioned at this discontinuity (mismatch interface) is given a dangling bond, electrically neutral conditions are locally disturbed and hence, repulsion and attraction forces act, causing to generate stresses (depicted by arrows in the figure) parallel to the interface.

The direction in which stress acts is determined by the orientation direction of each crystal plane or other factors. Therefore, at the mismatch interface oblique in a particular direction, stress acts in the particular direction. Thus, internal stress remains behind and adhesive force lowers.

According to the invention that intends to prevent the internal stress from remaining behind or to reduce the internal stress, the directions in which stresses act at the mismatch interface $I_{12/11}$ are dispersed to generate reversal stresses such that the stresses are offset. That is, according to the invention, the close-packed planes (lattice plane 11p) of crystal lattices of crystal grains in polycrystalline SiC substrate 11 are randomly oriented with reference to a normal direction to the front surface (upper surface in FIG. 2) of monocrystalline SiC layer 12 (dispersedly oriented with the orientation direction of close-packed plane in monocrystalline SiC layer 12 set as a center axis). A tensile stress and a compressive stress are equally generated to offset each other in any directions, thereby establishing zero or low stress (internal stress of not more than 0.1 GPa) over the entire interface (mismatch interface $I_{12/11}$) between monocrystalline SiC layer 12 and polycrystalline SiC substrate 11.

In this embodiment, provided that the close-packed plane of crystal lattice of each crystal grain in polycrystalline SiC substrate 11 is oriented obliquely or at a deflection angle θ relative to the front surface (reference surface) of monocrystalline SiC layer 12 (FIG. 2), the proportion of crystal grains satisfying θ≤−2° or 2°≤θ is preferably at least 32%, more preferably at least 50% of overall crystal grains of which polycrystalline SiC substrate 11 is composed. If this proportion is less than 32%, then crystal grains satisfying −2°<θ<2° account for at least 68%, and the proportion of match (or coherent) interface relative to interface area increases, specifically the proportion of SiC crystals whose close-packed plane is oriented in a particular direction (e.g., a normal direction to the front surface (upper surface in FIG. 2) of monocrystalline SiC layer 12) increases, whereby the stress offsetting effect is compromised. Then the internal stress in the vicinity of the interface between monocrystalline SiC layer 12 and polycrystalline SiC substrate 11 increases, with the risk of separation or deformation occurring. It is noted that θ=0° is the average (center) of orientation distribution, that is, the close-packed plane is oriented relative to a normal direction to the front surface (reference surface) of monocrystalline SiC layer 12 (the close-packed plane is parallel to the reference surface).

In order to increase the adhesive force to polycrystalline SiC substrate 11, it is preferred that the close-packed planes of crystals of monocrystalline SiC layer 12 be parallel to the interface. However, the crystal plane must be slightly oblique before step-flow epitaxial growth can develop at the front surface of the monocrystalline SiC layer 12. With these taken into account, it is desired that the close-packed plane of crystal lattice of monocrystalline SiC layer 12 have a deflection angle of from more than 0° to 10° at its interface with polycrystalline SiC substrate 11. If the close-packed plane of crystal lattice of monocrystalline SiC layer 12 has a deflection angle in excess of 10°, the energy at the mismatch interface becomes high, with the risks of the adhesive force between monocrystalline SiC layer 12 and polycrystalline SiC substrate 11 being compromised, the frequency of occurrence of dislocation at the interface being increased, and the dislocation at the interface propagating into monocrystalline SiC layer 12.

It is noted that for the reason that the interface between monocrystalline SiC layer 12 and polycrystalline SiC substrate 11 is a mismatch interface $I_{12/11}$, even when dislocations occur within polycrystalline SiC substrate 11, propagation of dislocations into monocrystalline SiC layer 12 is prohibited by the mismatch interface $I_{12/11}$. Also even when dislocations are induced within monocrystalline SiC layer 12 in proximity to the interface by localized stresses, these dislocations propagate isotropically so that propagating dislocations and stacking faults are mutually terminated. As a result, the monocrystalline SiC layer 12 having a low defect density surface is obtainable.

As understood from the foregoing, the SiC composite substrate 10 of the invention has several advantages: (1) a bowing caused by differential thermal expansion from the handle substrate is eliminated because there is no difference in thermal expansion between monocrystalline SiC layer 12 and polycrystalline SiC substrate 11; (2) no damages, complex defects, twins or stacking faults are introduced into monocrystalline SiC layer 12; (3) the mechanical strength at the monocrystalline SiC layer 12/polycrystalline SiC substrate 11 interface is not compromised, i.e., monocrystalline SiC layer 12 is tightly bonded or joined to polycrystalline SiC substrate 11; (4) metal contamination is eliminated because of exclusion of an intervening metal layer between polycrystalline SiC substrate 11 and monocrystalline SiC layer 12; (5) because of exclusion of an insulating layer between polycrystalline SiC substrate 11 and monocrystalline SiC layer 12, the SiC composite substrate is suited for use as substrate material for discrete devices adapted for current flow in a vertical direction, or substrate material for power semiconductor devices with variable electric resistivity.

[Manufacture of SiC Composite Substrate]

In manufacturing the inventive SiC composite substrate 10 defined herein, a method of depositing polycrystalline SiC on a monocrystalline SiC layer as handle substrate as described in Patent Document 1 (JP 5051962) is preferably employed because epitaxial growth of monocrystalline SiC on a polycrystalline substrate is impossible. Notably, formation of nuclei oriented in random directions at the surface of the monocrystalline SiC layer on which polycrystalline SiC is deposited is necessary when polycrystalline SiC is deposited on the surface of the monocrystalline SiC layer serving as the interface with the polycrystalline SiC substrate, such that the orientation directions of its lattice planes are random with reference to a normal direction to the front surface of the monocrystalline SiC layer which is remote from the surface on which polycrystalline SiC is deposited (that is, equally dispersed in directions rotating about the normal axis to the interface). To meet the necessity, the conditions under which the polycrystalline SiC substrate is formed are limited. In fact, there are needs to search for crystal growth conditions under which polycrystalline SiC is not oriented in the particular direction at the surface of the monocrystalline SiC layer on which polycrystalline SiC is deposited, to optimize the conditions (dispersion and uniformity of orientation directions), and to search for metastable amorphotizing conditions. It is thus not easy to establish the structure of the inventive SiC composite substrate 10. This is because crystal growth has the nature that a plane of the lowest energy is preferentially exposed on the surface, and also the propensity that a particular plane direction is oriented (preferentially oriented) in a normal axis direction of the surface.

Ascertaining the conception that when the surface of a monocrystalline SiC layer which becomes the interface with a polycrystalline SiC substrate serving as handle substrate has been intentionally impaired in smoothness or roughened, the close-packed planes (lattice planes) of polycrystalline SiC crystals to be deposited thereon can be randomly oriented as defined above, and continuing extensive investigations, the inventors have reached the present invention.

That is, the method for manufacturing an SiC composite substrate according to the invention is a method for manufacturing an SiC composite substrate 10 comprising a polycrystalline SiC substrate 11 and a monocrystalline SiC layer 12 thereon, comprising the steps of forming a monocrystalline SiC thin film on one major surface of a support substrate, mechanically working the surface of the monocrystalline SiC thin film for roughening, and removing defects caused by mechanical working, to form a monocrystalline SiC layer having a surface which is more rugged than the surface of the layer adjacent to the support substrate, the rugged surface being composed of oblique surface segments which are randomly oriented with reference to a normal direction to the surface of the layer adjacent to the support substrate, depositing polycrystalline SiC on the rugged surface of the monocrystalline SiC layer by chemical vapor deposition, thereby forming a polycrystalline SiC substrate wherein the close-packed planes of polycrystalline SiC crystals are randomly oriented with reference to a normal direction to the surface of the monocrystalline SiC layer adjacent to the support substrate, and thereafter physically and/or chemically removing the support substrate.

The surface roughening treatment by the predetermined mechanical working of the surface of the monocrystalline SiC layer 12 which becomes the interface with the polycrystalline SiC substrate 11 (the surface on which polycrystalline SiC is deposited) is not particularly limited as long as mechanical working ensures to form a rugged surface which is composed of oblique surface segments which are randomly oriented with reference to a normal direction to the surface of the layer adjacent to the support substrate. For example, the preferred step of roughening the surface of the monocrystalline SiC thin film is by polishing the surface of the monocrystalline SiC thin film in random directions with diamond abrasive grits. At this point, the degree of roughening (dimensions of protrusions and depressions, randomness of orientation directions of oblique surface segments) may be adjusted in terms of the diameter of diamond abrasive grits, the pressure applied to the surface subject to roughening treatment, and the treatment time.

Herein, the ruggedness of the surface of monocrystalline SiC layer 12 may be specified by surface roughness and the orientation states of oblique surface segments of which the rugged surface is composed. As used herein, the surface roughness refers to, for example, arithmetic average roughness Ra, maximum height roughness Rz, root-mean-square roughness Rq (surface roughness RMS according to JIS B0501-2013), or the like.

Preferably, the ruggedness on the surface of the monocrystalline SiC layer 12 on which polycrystalline SiC is to be deposited is demonstrated by an arithmetic average roughness Ra of from 1 nm to 100 nm, and the maximum gradients of oblique surface segments of which the rugged surface is composed range, in any directions, from 2° to 10° with reference to the surface of monocrystalline SiC layer 12 adjacent to the support substrate. Notably, the oblique surface segments of which the rugged surface is composed are basis surface segments on which polycrystalline SiC deposits, so that the close-packed planes of polycrystalline SiC are parallel to the basis surface segments. This is because the close-packed planes having minimum surface energy tend to predominantly cover the crystal surface. Then, as long as the monocrystalline SiC surface is randomly rugged, the directions in which crystal grains of polycrystalline SiC substrate 11 grow on the monocrystalline SiC layer 12 are intentionally changed random. That is, this structure ensures that even if crystal grains of a polycrystalline SiC substrate are preferentially oriented with reference to the surface of the monocrystalline SiC layer 12, the orientation directions of lattice planes 11*p* of polycrystalline SiC crystals in the polycrystalline SiC substrate 11 are dispersedly oriented each in conformity to the direction of every oblique surface segment of which the rugged surface of monocrystalline SiC layer 12 adjacent to the interface is composed (randomly oriented with reference to a normal direction to the surface of monocrystalline SiC layer 12 adjacent to the support substrate) as shown in FIG. 2. Thus, as long as the maximum gradients of oblique surface segments of which the rugged surface of the monocrystalline SiC layer 12 on which polycrystalline SiC is to be deposited is composed range from 2° to 10° in any directions, the orientation directions of lattice planes 11*p* of polycrystalline SiC crystals in the polycrystalline SiC substrate 11 are dispersedly oriented at a gradient of 2° to 10°.

Particularly when the orientation directions of oblique surface segments with a deflection angle θ of which the rugged surface of monocrystalline SiC layer 12 in abutment with polycrystalline SiC substrate 11 is composed are equally distributed, as shown in FIG. 2, in directions of rotational symmetry about the normal axis at the interface between polycrystalline SiC substrate 11 and monocrystalline SiC layer 12 (or the surface of monocrystalline SiC layer 12 adjacent to the support substrate), the stress offsetting effect is developed to a full extent because the microscopic structure at the mismatch interface randomly changes with respect to any directions. Notably, it is not preferred that the orientation directions of oblique surface segments with a deflection angle θ of which the rugged surface of monocrystalline SiC layer 12 in abutment with polycrystalline SiC substrate 11 is composed are biased in a certain direction, because of the result that stresses concentrate in the certain direction, inducing a bowing of the SiC composite substrate.

Also, if the surface of monocrystalline SiC layer 12 on which polycrystalline SiC is to be deposited has an arithmetic average roughness Ra of less than 1 nm, it becomes impossible to provide a sufficient area to each of oblique surface segments of which the rugged surface is composed, the size of polycrystalline SiC grains deposited on the oblique surface segment becomes small, with the risk of failing to provide the polycrystalline SiC substrate 11 with mechanical strength for handle substrates and low resistivity for semiconductor substrates. If the arithmetic average roughness Ra exceeds 100 nm, the monocrystalline SiC layer must have a thickness of at least 100 nm in order for the layer to exert the stress offsetting effect, suggesting that the cost reducing effect of the composite substrate may not be expectable in some cases. In addition, an undulation (protrusions and depressions) of more than 100 nm in height must be formed on the monocrystalline SiC layer. Then extra damages are introduced in the monocrystalline SiC layer, failing to maintain the crystal quality of substrates for power semiconductor devices. With the possibility of processing the monocrystalline SiC layer surface for undulation being taken into account, the surface of the monocrystalline SiC layer on which polycrystalline SiC is to be deposited should more preferably have an arithmetic average roughness Ra of 1 nm to 10 nm, even more preferably 1 nm to 5 nm.

In the inventive method for manufacturing an SiC composite substrate, the step of forming a monocrystalline SiC thin film on a support substrate preferably includes stripping a monocrystalline SiC thin film from a monocrystalline SiC substrate by the ion implantation separation method and transferring the monocrystalline SiC thin film onto the support substrate. Alternatively, the step of forming a monocrystalline SiC thin film on a support substrate preferably includes hetero-epitaxially growing SiC on the support substrate. Since this means that a monocrystalline SiC layer 12 having the necessary minimum thickness and governing the properties of SiC composite substrate is obtained by performing once ion implantation separation operation or hetero-epitaxial growth, an SiC composite substrate having improved properties may be prepared in an economical manner.

Also the CVD method for forming the polycrystalline SiC substrate 11 is preferably thermal CVD. Since polycrystalline SiC is formed on the monocrystalline SiC layer 12 by deposition, a need for the step of highly flattening SiC (difficult-to-grind material) by grinding, polishing or CMP as in the prior art is eliminated.

Also the support substrate is preferably formed of a material which is easy to process by the ion implantation separation method, susceptible to physical and/or chemical removal (i.e., machining or etching), and has no substantial difference in coefficient of thermal expansion from SiC, more preferably polycrystalline or monocrystalline silicon. Where a monocrystalline Si wafer is employed as the support substrate, large-diameter substrates of quality are available at a low cost, whereby the manufacture cost of SiC composite substrates is reduced. The monocrystalline Si wafer allows for hetero-epitaxial growth of monocrystalline cubic SiC thereon, eliminating a need for the step of bonding or separating a monocrystalline SiC substrate. As a result, SiC composite substrates having a larger diameter than commercially available bulk form SiC wafers can be manufactured at a low cost.

Since the bulk form monocrystalline SiC is expensive, it is economically not preferable to manufacture SiC composite substrates using monocrystalline SiC substrates as such or using monocrystalline SiC substrates basically. Thus, an SiC composite substrate is manufactured according to the invention by stripping a monocrystalline SiC thin film from a monocrystalline SiC wafer as in Patent Document 1 (JP 5051962), transferring the thin film to a support substrate to provide for apparent mechanical strength, providing the monocrystalline SiC thin film on its surface with predetermined ruggedness (isotropic oblique surface segments or undulation), thereafter depositing polycrystalline SiC thereon to form a polycrystalline SiC substrate.

If the support substrate has a coefficient of thermal expansion which is largely different from those of the monocrystalline SiC layer and the polycrystalline SiC substrate, the laminate including the support substrate can be bowed by temperature changes during manufacture of the composite substrate. If such a bowing occurs in the manufacture process, there is a risk that a flat SiC composite substrate may not be obtained because the shape of SiC composite substrate reflects the bowing of the support substrate despite the stress-reducing or relieving means taken at the interface between monocrystalline SiC layer and polycrystalline SiC substrate. If the SiC composite substrate lacks flatness, then it is difficult to apply the photolithography process such as device fabrication process, preventing practical implementation of SiC composite substrates.

For the purpose of preventing the laminate including the support substrate from bowing even when there is a difference in coefficient of thermal expansion between the support substrate and the monocrystalline SiC layer 12 or polycrystalline SiC substrate 11, it is preferable to deposit a polycrystalline SiC substrate (serving as handle substrate) on each of opposite surfaces of the support substrate in the laminate. In this case, even when a stress is induced by the difference in coefficient of thermal expansion between the support substrate and the polycrystalline SiC substrate, the stresses acting on the front and back surfaces of the support substrate are directed in mutually opposite directions and of equal magnitude. This ensures that no bowing occurs in the laminate at any treatment temperatures. As a result, an SiC composite substrate free of bowing is available. In addition, the support substrate is increased in apparent rigidity, which promotes the motion of dislocations within the polycrystalline SiC substrate and relieves residual stresses, enabling to manufacture an SiC composite substrate which is thermally and mechanically stable.

In one preferred embodiment, for example, a monocrystalline SiC layer carrier having the monocrystalline SiC layer only on the front surface of the support substrate is manufactured, the polycrystalline SiC substrates are formed on the rugged surface of the monocrystalline SiC layer and the back surface of the support substrate, respectively, and thereafter the support substrate is physically and/or chemically removed.

In another preferred embodiment, a monocrystalline SiC layer carrier having the monocrystalline SiC layers on both surfaces of the support substrate is manufactured, the polycrystalline SiC substrate is formed on the rugged surface of each monocrystalline SiC layer, and thereafter the support substrate is physically and/or chemically removed. Since two SiC composite substrates can be manufactured through the single step of forming polycrystalline SiC substrate, the effect of reducing manufacture cost is enhanced.

In a further preferred embodiment which is adopted when it is difficult to form the monocrystalline SiC layers on both surfaces of the support substrate, two monocrystalline SiC layer carriers are manufactured, each carrier having the monocrystalline SiC layer only on the front surface of the support substrate, the back surfaces of the support substrates of the monocrystalline SiC layer carriers are bonded together, the polycrystalline SiC substrates are formed on the rugged surfaces of the monocrystalline SiC layers on the front and back surfaces of the bonded substrates, respectively, then the assembly is divided at the bonded interface between the back surfaces of the support substrates, and subsequently the support substrates are physically and/or chemically removed. In this case, a set of support substrates having monocrystalline SiC layers substantially on both surfaces can be formed. That is, two SiC composite substrates are formed through the single step of forming polycrystalline SiC substrate, achieving cost reduction, flattening and stabilization.

Described below are Embodiments 1 to 4 of the method for manufacturing an SiC composite substrate according to the invention.

Embodiment 1

Referring to FIG. 4, Embodiment 1 of the invention is described.
(Step 1-1)

There is first furnished a monocrystalline SiC substrate 12s to be bonded to a support substrate 21. The monocrystalline SiC substrate 12s is preferably selected from substrates of 4H—SiC, 6H—SiC and 3C—SiC crystalline structure. The size of monocrystalline SiC substrate 12s and support substrate 21 is set in accordance with the size necessary for fabrication of semiconductor devices and growth of gallium nitride, diamond or nano-carbon film, cost, and other factors. It is preferred from the aspect of handling that the thickness of monocrystalline SiC substrate 12s is approximate to the substrate thickness prescribed in the SEMI standards or JEIDA standards. The monocrystalline SiC substrate 12s used herein may be a commercially available product, for example, a commercially available monocrystalline SiC wafer for power devices, preferably having a flat and smooth surface which has been finish polished by chemical-mechanical polishing (CMP) or planarization treatment. In this embodiment, a monocrystalline SiC wafer whose 4H—SiC (000-1) C plane, for example, is twice deflected in [11-20] direction is used as the monocrystalline SiC substrate 12s.

Also preferably, a predetermined thin film 22a is formed on at least the surface of monocrystalline SiC substrate 12s to be bonded to support substrate 21 as shown in FIG. 4(a). The thin film 22a may be a dielectric film in the form of a silicon oxide, silicon nitride or silicon oxynitride film having a thickness of the order of 50 nm to 600 nm. The dielectric film not only facilitates bonding to support substrate 21, but is also effective for suppressing channeling of implanting ions during ion implantation treatment to be performed later.

The thin film 22a may be formed by any methods as long as a thin film in tight contact with monocrystalline SiC substrate 12s can be formed. For example, the silicon oxide film may be formed by the PECVD or thermal oxidation method, and the silicon nitride and silicon oxynitride films be formed by the sputtering method.

(Step 1-2)

Next, a support substrate 21 is furnished. The support substrate 21 used herein is preferably a substrate of a refractory material (exclusive of monocrystalline SiC) having a heat resistance temperature of at least 1,100° C., more preferably polycrystalline or monocrystalline silicon. In this embodiment, a monocrystalline Si substrate whose face direction is in (111) plane is used as support substrate 21.

Also preferably, a thin film 22a as in step (1-1) is formed on at least the surface of support substrate 21 to be bonded to monocrystalline SiC substrate 12s as shown in FIG. 4(b).
(Step 1-3)

Next, hydrogen or similar ions are implanted into the thin film 22a-bearing surface of monocrystalline SiC substrate 12s to define an ion implanted region 12i as shown in FIG. 4(c).

During ion implantation into monocrystalline SiC substrate 12s, hydrogen ions (H$^+$) or hydrogen molecule ions (H$_2$) are implanted with a sufficient implanting energy to define the ion implanted region 12i at a desired depth from the substrate surface and in a predetermined dose. With respect to these conditions, the ion implanting energy may be set so that a thin film having a desired thickness may be obtained. At this point, He, B or other ions may be simultaneously implanted, and ions of any type may be used as long as the equivalent effect is obtained. However, ions of a lighter element are desirable from the standpoint of mitigating any damage to monocrystalline SiC crystal lattices.

The dose of hydrogen ions (H$^+$) implanted into monocrystalline SiC substrate 12s is preferably $1.0\times10^{16}$ atom/cm$^2$ to $9.0\times10^{17}$ atom/cm$^2$. If the dose is less than $1.0\times10^{16}$ atom/cm$^2$, no interface embrittlement may occur in some cases. If the dose is more than $9.0\times10^{17}$ atom/cm$^2$, ions will form bubbles during heat treatment subsequent to the bonding, resulting in transfer failure.

When hydrogen molecule ions (H$_2^+$) are used as the implanting ion, the dose is preferably $5.0\times10^{15}$ atom/cm$^2$ to $4.5\times10^{17}$ atom/cm$^2$. If the dose is less than $5.0\times10^{15}$ atom/cm$^2$, no interface embrittlement may occur in some cases. If the dose is more than $4.5\times10^{17}$ atom/cm$^2$, ions will form bubbles during heat treatment subsequent to the bonding, resulting in transfer failure.

The depth from the ion implanted substrate surface to the ion implanted region 12i (i.e., depth of ion implantation), which corresponds to the desired thickness of a monocrystalline SiC thin film to be formed on support substrate 21, is typically 100 to 2,000 nm, preferably 300 to 500 nm, more preferably about 400 nm. The thickness of ion implanted region 12i (i.e., ion distribution thickness), which is selected such that a thin film may be easily separated by mechanical impact or similar means, is preferably 200 to 400 nm, more preferably about 300 nm.
(Step 1-4)

Subsequently, the thin film 22a-bearing surface of monocrystalline SiC substrate 12s and the thin film 22a-bearing surface of support substrate 21 are subjected to surface activation treatment and bonded together. The surface activation treatment may be plasma activation treatment, vacuum ion beam treatment or immersion treatment in ozonated water.

Among these treatments, the plasma activation treatment is carried out by placing monocrystalline SiC substrate 12s and/or support substrate 21 which has been treated until step (1-3) in a vacuum chamber, introducing a plasma-forming gas under reduced pressure, and exposing the substrate to a RF plasma at about 100 W for about 5 to 10 seconds for thereby activating the substrate surface with the plasma. The plasma-forming gas used herein may be oxygen gas, hydrogen gas, nitrogen gas, argon gas, or a mixture thereof, or a mixture of hydrogen gas and helium gas.

In the case of vacuum ion beam treatment, activation treatment is carried out by placing monocrystalline SiC substrate 12s and/or support substrate 21 in a high-vacuum chamber, and directing an ion beam of Ar or the like to the substrate surface to be bonded.

In the case of immersion treatment in ozonated water, surface activation treatment is carried out by immersing monocrystalline SiC substrate 12s and/or support substrate 21 in water having ozone gas dissolved therein.

The surface activation treatment may be carried out only on monocrystalline SiC substrate 12s or only on support substrate 21, but preferably on both monocrystalline SiC substrate 12s and support substrate 21.

The surface activation treatment may be either one of the above-described treatments, or a combination thereof. The surfaces of monocrystalline SiC substrate 12s and support substrate 21 subject to surface activation treatment are preferably the surfaces to be bonded, i.e., the surfaces of thin films 22a.

Next, the monocrystalline SiC substrate 12s and support substrate 21 are bonded together with their activated surfaces (surfaces of thin films 22a) mated with each other.

Once the monocrystalline SiC substrate 12s and support substrate 21 are bonded together, preferably heat treatment is carried out at a temperature of 150 to 350° C., more preferably 150 to 250° C., for thereby enhancing the bond strength at the juncture between the thin films 22a and 22a. While a bowing of the substrates occurs at this point due to a difference in coefficient of thermal expansion between monocrystalline SiC substrate 12s and support substrate 21, it is recommended to suppress bowing by selecting an appropriate temperature for each substrate material. The heat treatment time, which somewhat depends on the temperature, is preferably 2 to 24 hours.

By the heat treatment, the thin films 22a and 22a are closely bonded into a single layer or interposing layer 22, yielding a bonded substrate 13 in which monocrystalline SiC substrate 12s and support substrate 21 are tightly and closely bonded via the interposing layer 22 as shown in FIG. 4(d).
(Step 1-5)

A thermal or mechanical energy is applied to the ion implanted portion in the bonded substrate 13 to separate monocrystalline SiC substrate 12s along ion implanted region 12i, yielding a monocrystalline SiC thin film carrier 14 having a monocrystalline SiC thin film 12a transferred onto support substrate 21 as shown in FIG. 4(e).

Applicable as the separating means is a thermal separation method of heating the bonded substrate 13 at a high temperature to thermally generate microbubbles of ion implanted component in the ion implanted region 12i, causing stripping, whereby the monocrystalline SiC substrate 12s is separated. Also applicable is a mechanical separation method of applying physical impact to one end of the ion implanted region 12i, while effecting heat treatment at a low temperature insufficient to cause thermal stripping (e.g., 500 to 900° C., preferably 500 to 700° C.), causing mechanical stripping, whereby the monocrystalline SiC substrate 12s is separated. The mechanical separation method is preferable to the thermal separation method since the transfer surface after the transfer of a monocrystalline SiC thin film has a relatively low roughness.

It is noted that the separation treatment may be followed by heat treatment for improving the adhesion between monocrystalline SiC thin film 12a and support substrate 21. Specifically, the monocrystalline SiC thin film carrier 14 may be heated at a temperature of 700 to 1,000° C. higher than that of the separation treatment for a time of 1 to 24 hours.

Since the thin films 22a and 22a are tightly bonded to each other and thin films 22a and 22a are tightly bonded to the monocrystalline SiC substrate 12s and support substrate 21 at this point, no separation occurs at any sites other than the separation site of ion implanted region 12i.

The monocrystalline SiC substrate 12s as separated may be reused as a bonding substrate in the course of preparing monocrystalline SiC thin film carrier 14, after polishing or cleaning of its surface again.
(Step 1-6)

Next, the monocrystalline SiC thin film 12a of monocrystalline SiC thin film carrier 14 is roughened on its surface by mechanical working, and defects caused by the mechanical working are removed, yielding a monocrystalline SiC layer 12 as shown in FIG. 4(f).

The surface roughening treatment by mechanical working is preferably by polishing the surface of monocrystalline SiC thin film 12a in random directions with diamond abrasive grits for thereby roughening the surface of monocrystalline SiC thin film 12a. Specifically, buff polishing may be carried out by forcing the surface of monocrystalline SiC thin film 12a in monocrystalline SiC thin film carrier 14 against an abrasive cloth impregnated with a diamond slurry while rotating the abrasive cloth, and changing the direction of monocrystalline SiC thin film carrier 14 so as to conduct polishing in random directions. The surface of monocrystalline SiC substrate 12s is originally smooth, the surface of monocrystalline SiC thin film 12a adjacent to support substrate 21 reflects the smooth surface of monocrystalline SiC substrate 12s, the buff polished surface of monocrystalline SiC thin film 12a is roughened as compared with the smooth surface adjacent to support substrate 21 and has fine surface protrusions and depressions. Also, the surface of monocrystalline SiC thin film 12a is a plane of ion implantation separation, and the buffing work in random polishing directions as mentioned above enables to remove the ion implantation-damaged layer, and to establish the finely rugged surface state that oblique surface segments of which the rugged surface is composed are oriented in random directions with reference to a normal direction to the surface of the thin film adjacent to support substrate 21.

It is noted that the degree of roughening of monocrystalline SiC layer 12 (dimensions of protrusions and depressions, randomness of orientation directions of oblique surface segments) may be adjusted in terms of the diameter of diamond abrasive grits, the pressure under which monocrystalline SiC thin film carrier 14 is forced, and the polishing time.

Since defects as damaged by mechanical working (buffing work) are present on the surface of monocrystalline SiC thin film 12a, the subsequent treatment is to remove the defects. Specifically, thermal oxidation treatment is carried out on monocrystalline SiC thin film 12a as worked, to form a thin thermally oxidized film. By this treatment, the defective layer damaged by mechanical working of the surface of monocrystalline SiC thin film 12a is converted to a thermally oxidized film. At this point, the ion implantation-damaged region is included in the thermally oxidized film. Next, the surface of monocrystalline SiC thin film 12a is immersed in a hydrofluoric acid bath to remove the thermally oxidized film and expose the clean monocrystalline SiC surface (sacrificial oxidation method). By subjecting the monocrystalline SiC thin film 12a of monocrystalline SiC thin film carrier 14 to the foregoing treatments, there is obtained a monocrystalline SiC layer 12 having a rugged surface in the sense that the treated surface is more rugged than the surface of the layer adjacent to support substrate 21 and the oblique surface segments of which the rugged surface is composed are oriented in random directions with reference to a normal direction to the surface of the layer adjacent to support substrate 21.

Herein the ruggedness on the surface of monocrystalline SiC layer 12 is preferably such that the rugged surface has an arithmetic average roughness Ra of from 1 nm to 100 nm, and the maximum gradients of oblique surface segments of which the rugged surface is composed range from 2° to 10° in any directions. That is, the surface roughness of monocrystalline SiC layer 12 on its surface is, for example, such that both the surface roughness in a certain direction (X direction) on the surface of monocrystalline SiC layer 12 and the surface roughness in a direction perpendicular thereto (Y direction) are in a range of preferably 1 to 100 nm, more preferably 5 to 30 nm, as expressed by arithmetic average roughness Ra.

The phrase that the oblique surface segments of which the rugged surface of monocrystalline SiC layer 12 is composed are oriented in random directions with reference to a normal direction to the surface of the layer adjacent to support substrate 21 means that the surface roughness in a certain direction (X direction) on the surface of monocrystalline SiC layer 12 and the surface roughness in a direction perpendicular thereto (Y direction) are substantially equal. The phrase that the surface roughnesses in orthogonal directions are substantially equal means, for example, that the difference in arithmetic average roughness Ra between both the surface roughnesses is preferably up to 10% of the maximum Ra, more preferably up to 5% of the maximum Ra; or that the surface roughness profile in X direction on the surface of monocrystalline SiC layer 12 and the surface roughness profile in Y direction show substantially the same pattern. The phrase that the surface roughness profiles in X and Y directions show substantially the same pattern means that orientation directions of oblique surface segments of the surface are isotropic and their differences in latitude are likewise.

Through the above step, there is obtained a monocrystalline SiC layer carrier 15 in which monocrystalline SiC layer 12 having the rugged surface is carried on support substrate 21 via interposing layer 22 as shown in FIG. 4(f).

(Step 1-7)

Next step deals with the resulting monocrystalline SiC layer carrier 15. Polycrystalline SiC is deposited on monocrystalline SiC layer 12 by the CVD method to form a polycrystalline SiC substrate 11 as shown in FIG. 4(g).

In this step, deposition is such that the close-packed planes of polycrystalline SiC crystals are randomly oriented with reference to a normal direction to the surface of monocrystalline SiC layer 12 adjacent to support substrate 21.

Preferably thermal CVD is used as the CVD method. Thermal CVD conditions may be ordinary conditions under which polycrystalline SiC is deposited to form a film.

In the step, polycrystalline SiC deposits on the surface of monocrystalline SiC layer 12. Since the surface of monocrystalline SiC layer 12 is a rugged surface as defined above, crystals grow such that for each of oblique surface segments of which the rugged surface is composed, the close-packed plane (lattice plane) of polycrystalline SiC crystal is oriented parallel to that oblique surface segment. For each of crystal grains in polycrystalline SiC substrate 11 on monocrystalline SiC layer 12, its growth direction varies randomly. As a result, orientation directions of lattice planes 11$p$ of polycrystalline SiC crystals in polycrystalline SiC substrate 11 are dispersedly oriented, as shown in FIG. 2, in compliance with the direction of each of oblique surface segments of which the rugged surface of monocrystalline SiC layer 12 on the interface side is composed, that is, randomly oriented with reference to a normal direction to the surface of monocrystalline SiC layer 12 adjacent to support substrate 21.

It is noted with respect to monocrystalline SiC layer carrier 15 that preferably, not only polycrystalline SiC substrate 11 is formed on the surface (front surface) of support substrate 21 on which monocrystalline SiC layer 12 is formed, but also a polycrystalline SiC substrate 11' is formed on the opposite surface (back surface) as shown in FIG. 4(g). Even when stresses are generated due to a difference in coefficient of thermal expansion between support substrate 21 and polycrystalline SiC substrates 11, 11', the stresses applied to the front and back surfaces of support substrate 21 by polycrystalline SiC substrates 11, 11' act in opposite directions and are of equal magnitude, preventing the laminate from bowing. As a result, an SiC composite substrate free of bowing is obtained.

(Step 1-8)

Next, the support substrate 21 is physically and/or chemically removed from the laminate obtained in step (1-7), yielding an SiC composite substrate 10 as shown in FIG. 4(h). In this step, when the support substrate 21 is of silicon, it may be readily removed, for example, by selective etching with hydrofluoric/nitric acid solution.

(Step 1-9)

If necessary, an SiC epitaxial layer 12' may be formed on monocrystalline SiC layer 12 of SiC composite substrate 10 as shown in FIG. 4(i). Although the thickness of monocrystalline SiC layer 12 is as thin as 0.1 µm and is too thin to use as an active layer of power semiconductor devices, an SiC composite substrate complying with the fabrication of power semiconductor devices is obtained when an SiC epitaxial layer 12' of 8 µm thick is formed by feeding $SiH_2Cl_2$ at a flow rate of 200 sccm and $C_2H_2$ at a flow rate of 50 sccm, and conducting vapor phase growth (homoepitaxial growth) at 1,550° C. for 1 hour.

Embodiment 2

Referring to FIG. 5, Embodiment 2 of the invention is described.

(Step 2-1)

By first following the procedure of Embodiment 1 until step (1-6), there are furnished two monocrystalline SiC layer carriers 15 as shown in FIG. 5(a).

(Step 2-2)

Next, the support substrates 21 of two monocrystalline SiC layer carriers 15 are joined or bonded together via an adhesive layer 23 to form an adhesively bonded assembly 16 as shown in FIG. 5(b). The adhesively bonded assembly 16 is a double side substrate in which monocrystalline SiC layers 12 are exposed on the front and back surfaces. In this step, an adhesive having heat resistance to subsequent CVD is preferably used.

(Step 2-3)

Next, polycrystalline SiC is deposited on each of the rugged surfaces of monocrystalline SiC layers 12 on the front and back surfaces of the adhesively bonded assembly 16 by conducting CVD as in Embodiment 1, to form a polycrystalline SiC substrate 11 as shown in FIG. 5(c). Even when stresses are generated due to a difference in coefficient of thermal expansion between support substrate 21 and polycrystalline SiC substrate 11, the stresses applied to the front and back surfaces of bonded support substrates 21 act in opposite directions and are of equal magnitude, preventing the laminate from bowing. As a result, two SiC composite substrates free of bowing are obtained.

(Step 2-4)

Next, the laminate resulting from step (2-3) is divided at the bonded portion (adhesive layer 23) between the back surfaces of support substrates 21 and simultaneously or subsequently support substrates 21 are physically and/or chemically removed, yielding two SiC composite substrates 10 as shown in FIG. 5(d). In this step, when the support substrates 21 are of silicon, the adhesive layer 23 and support substrates 21 may be removed, for example, by selective etching with hydrofluoric/nitric acid solution.

(Step 2-5)

If necessary, as in Embodiment 1, an SiC epitaxial layer 12' may be formed on monocrystalline SiC layer 12 of SiC composite substrate 10 as shown in FIG. 5(e).

Embodiment 3

Referring to FIG. 6, Embodiment 3 of the invention is described.

(Step 3-1)

First, by hetero-epitaxially growing SiC on a support substrate 21 to form a monocrystalline SiC thin film 12e, two monocrystalline SiC thin film carriers 14' are furnished as shown in FIG. 6(a). For example, two monocrystalline Si wafers having (001) surface are used as support substrate 21, and a 3C—SiC layer having (001) face as the major plane direction is hetero-epitaxially grown on each wafer. Specifically, prior to the hetero-epitaxial growth, support substrate (monocrystalline Si wafer) 21 may be heated from 500° C. to 1,340° C. while being exposed to a $C_2H_2$ atmosphere of 20 Pa, for thereby growing a monocrystalline 3C—SiC film to a thickness of 15 nm as a surface layer. Thereafter, by maintaining the substrate temperature, feeding $SiH_2Cl_2$ at a flow rate of 200 sccm and $C_2H_2$ at a flow rate of 50 sccm, and setting a pressure of 15 Pa, a monocrystalline 3C—SiC layer 12 of 20 μm thick having (001) face as the major plane direction may be epitaxially grown.

(Step 3-2)

Next, the surface of monocrystalline SiC thin film 12e of monocrystalline SiC thin film carrier 14' is roughened by mechanical working as in step (1-6) of Embodiment 1, and defects damaged by mechanical working are removed, yielding monocrystalline SiC layer 12 as shown in FIG. 6(b).

The mechanical working conditions and defect removing conditions used herein may be the same as in step (1-6) of Embodiment 1. As a result, monocrystalline SiC layer 12 has a rugged surface of the same roughness as in Embodiment 1.

Through the step, a monocrystalline SiC layer carrier 15' in which monocrystalline SiC layer 12 having a rugged surface is carried on support substrate 21 is obtained as shown in FIG. 6(b).

(Step 3-3)

Next, the support substrates 21 of two monocrystalline SiC layer carriers 15' are joined or bonded together via an adhesive layer 23 to form an adhesively bonded assembly 16' as shown in FIG. 6(c). The adhesively bonded assembly 16' is a double side substrate in which monocrystalline SiC layers 12 are exposed on the front and back surfaces. In this step, an adhesive having heat resistance to subsequent CVD is preferably used.

(Step 3-4)

Next, polycrystalline SiC is deposited on each of the rugged surfaces of monocrystalline SiC layers 12 on the front and back surfaces of the adhesively bonded assembly 16' by conducting CVD as in Embodiment 1, to form a polycrystalline SiC substrate 11 as shown in FIG. 6(d). Even when stresses are generated due to a difference in coefficient of thermal expansion between support substrate 21 and polycrystalline SiC substrate 11, the stresses applied to the front and back surfaces of bonded support substrates 21 act in opposite directions and are of equal magnitude, preventing the laminate from bowing. As a result, two SiC composite substrates free of bowing are obtained.

(Step 3-5)

Next, the laminate resulting from step (3-4) is divided at the bonded portion (adhesive layer 23) between the back surfaces of support substrates 21 and simultaneously or subsequently support substrates 21 are physically and/or chemically removed, yielding two SiC composite substrates 10 as shown in FIG. 6(e). In this step, when the support substrates 21 are of silicon, the adhesive layer 23 and support substrates 21 may be readily removed, for example, by selective etching with hydrofluoric/nitric acid solution.

Embodiment 4

Referring to FIG. 7, Embodiment 4 of the invention is described.

(Step 4-1)

First, by hetero-epitaxial growth of SiC on both surfaces of a support substrate 21, a monocrystalline SiC thin film carrier 14" having monocrystalline SiC thin films 12e is furnished as shown in FIG. 7(a). For example, a monocrystalline Si wafer having mirror polished (111) surfaces on both sides is used as support substrate 21, and a 3C—SiC layer is hetero-epitaxially grown on both the surfaces. Specifically, prior to the hetero-epitaxial growth, support substrate (monocrystalline Si wafer) 21 may be heated from 500° C. to 1,340° C. while being exposed to a $C_2H_2$ atmosphere of 20 Pa, for thereby growing a monocrystalline 3C—SiC film to a thickness of 15 nm as a surface layer. Thereafter, by maintaining the substrate temperature, feeding $SiH_2Cl_2$ at a flow rate of 200 sccm and $C_2H_2$ at a flow rate of 50 sccm, and setting a pressure of 3.2 Pa, a monocrystalline 3C—SiC layer 12 having (111) face as the major plane direction may be epitaxially grown.

Herein, epitaxial growth of 3C—SiC thick film should preferably be avoided as opposed to Embodiment 3. The reason is as follow. In the plane of 3C—SiC layer having (111) face as the major plane direction, the stress mitigating effect at the interface with the monocrystalline Si wafer having Si(111) surface does not develop even when stacking faults form. If the 3C—SiC layer is made thick, internal stresses accumulate to invite the risk of separation at the 3C—SiC layer/support substrate (monocrystalline Si wafer) interface or crack propagation into epitaxially grown 3C—SiC layer. It is thus recommended to limit epitaxial growth of 3C—SiC to a thickness of 2 μm as the upper limit by adjusting the time of epitaxial growth. Although a tensile stress in excess of 10 GPa generates within the 3C—SiC layer plane, internal stresses are balanced because the 3C—SiC layers are formed on the front and back surfaces of a monocrystalline Si wafer as support substrate 21. The support substrate 21 maintains flatness without being deformed.

(Step 4-2)

Next, the surfaces of monocrystalline SiC thin films 12e of monocrystalline SiC thin film carrier 14" are roughened by mechanical working as in step (1-6) of Embodiment 1, and defects damaged by mechanical working are removed, yielding monocrystalline SiC layers 12 as shown in FIG. 7(b).

The mechanical working conditions and defect removing conditions used herein may be the same as in step (1-6) of Embodiment 1. As a result, monocrystalline SiC layers 12 have a rugged surface of the same roughness as in Embodiment 1.

Through the step, a monocrystalline SiC layer carrier 15" in which monocrystalline SiC layers 12 having a rugged surface are carried on support substrate 21 is obtained as shown in FIG. 7(b).

(Step 4-3)

Next, polycrystalline SiC is deposited on each of the rugged surfaces of monocrystalline SiC layers 12 on the front and back surfaces of monocrystalline SiC layer carrier 15" by conducting CVD as in Embodiment 1, to form a polycrystalline SiC substrate 11 as shown in FIG. 7(c). Even when stresses are generated due to a difference in coefficient of thermal expansion between support substrate 21 and polycrystalline SiC substrate 11, the stresses applied to the front and back surfaces of support substrate 21 act in opposite directions and are of equal magnitude, preventing the laminate from bowing. As a result, two SiC composite substrates free of bowing are obtained.

(Step 4-4)

Next, by physically and/or chemically removing the support substrate 21 from the laminate obtained in step (4-3), two SiC composite substrates 10 are obtained as shown in FIG. 7(d). In this step, when the support substrate 21 is of silicon, it may be readily removed, for example, by selective etching with hydrofluoric/nitric acid solution.

Although Embodiments 1 to 4 of the invention have been described by referring to the vapor phase growth using a gas mixture of $SiH_2Cl_2$ and $C_2H_2$ in epitaxial growth of monocrystalline SiC as a typical example, the method of forming monocrystalline SiC is not limited thereto. Equivalent effects are achievable by reduced or atmospheric pressure vapor phase growth based on any combinations of silanes, chlorosilanes and hydrocarbons, or molecular beam epitaxy, or even liquid phase growth.

Also, mechanical working using diamond slurry is not always necessary for providing monocrystalline SiC layer 12 with a rugged surface. Such means as photolithography or nano-imprint may be employed as long as oblique surface segments of which the rugged surface is composed are oriented in random directions with reference to a normal direction to the surface of the monocrystalline SiC layer.

Reference is also made to a typical example using a silicon substrate as support substrate 21. If hetero-epitaxial growth of SiC as in Embodiments 3 and 4 is unnecessary, the support substrate need not be a monocrystalline Si substrate, and an inexpensive polycrystalline Si substrate may be used.

In Embodiments 2 and 3, the treatment for removal of defects caused by surface roughening of monocrystalline SiC thin film 12a by mechanical working or by the mechanical working per se is not necessarily limited to implementation prior to the mutual bonding of support substrates 21. The treatment for defect removal may be implemented in the assembly state of bonded support substrates 21 at a point of time prior to the formation or deposition of polycrystalline SiC substrate 11.

Although support substrates 21 are bonded via adhesive layer 23 in Embodiments 2 and 3, they may be bonded directly without interposing adhesive layer 23 as long as a sufficient bond strength is established.

EXAMPLES

Examples of the invention are given below by way of illustration, but not by way of limitation.

Example 1

An SiC composite substrate 10 according to the invention was prepared by the following procedure based on Embodiment 1 of the inventive method for manufacturing an SiC composite substrate.

(Step 1)

First, a monocrystalline 4H—SiC wafer having (000-1) C plane inclined 2° in [11-20] direction was furnished as the monocrystalline SiC substrate 12s. The wafer was subjected to thermal oxidation treatment in a dry oxygen atmosphere under atmospheric pressure at 1,100° C. for 90 minutes to form a thermally oxidized film of 0.2 μm thick as the thin film 22a on the surface as shown in FIG. 4(a).

(Step 2)

A monocrystalline Si wafer having (001) surface was furnished as the support substrate 21. The wafer was subjected to thermal oxidation treatment in a dry oxygen atmosphere under atmospheric pressure at 1,100° C. for 90 minutes to form a thermally oxidized film of 0.6 μm thick as the thin film 22a on the surface as shown in FIG. 4(b).

(Step 3)

Next, hydrogen ions were irradiated to the thermally oxidized film-bearing surface of the monocrystalline 4H—SiC wafer from step (1) at an energy level of 150 keV in a dose of $1 \times 10^{17}$ atoms/cm² to define an ion implanted region 12i as shown in FIG. 4(c).

(Step 4)

Subsequently, the thin film 22a-bearing surface of the monocrystalline 4H—SiC wafer and the thin film 22a-bearing surface of the monocrystalline Si wafer were subjected to plasma activation treatment and bonded together to form a bonded substrate 13 as shown in FIG. 4(d).

(Step 5)

Next, a mechanical energy was applied to the ion implanted portion in the bonded substrate 13 and a monocrystalline 4H—SiC wafer was separated at the ion implanted region 12i. The monocrystalline SiC thin film 12a was transferred to the monocrystalline Si wafer, yielding a monocrystalline SiC thin film carrier 14 having 4H—SiC (0001) Si plane exposed at the surface as shown in FIG. 4(e).

(Step 6)

Next, the 4H—SiC (0001) Si plane exposed at the surface of monocrystalline SiC thin film carrier 14 was forced against a polishing cloth coated with a slurry of diamond with a particle size of 10 μm under a pressure of 100 g/cm², and reciprocally moved in random directions. After the reciprocating motion for 10 minutes, the diamond slurry was washed away with pure water from the surface of monocrystalline SiC thin film 12a, which was cleaned with a mixture solution of aqueous hydrogen peroxide and sulfuric acid. Next, thermal oxidation treatment was performed in a dry oxygen atmosphere under atmospheric pressure at 1,100° C. for 60 minutes to form a thermally oxidized film of 0.1 μm thick on the polished surface of monocrystalline SiC thin film 12a. By this thermal oxidation treatment, the surface layer of monocrystalline SiC thin film 12a which had been damaged by diamond slurry polishing was converted to a silicon oxide film. Thereafter, the surface was immersed in a 5 vol % HF solution for 5 minutes, yielding a to monocrystalline SiC layer 12 having a clean monocrystalline 4H—SiC surface exposed as shown in FIG. 4(f). The monocrystalline SiC layer 12 after the treatment had a rugged surface with an arithmetic average roughness Ra of 3 nm wherein oblique surface segments of which the rugged surface was composed had a maximum gradient of 3° and were randomly oriented with reference to a normal direction to the surface of layer 12 adjacent to the monocrystalline Si wafer (support substrate 21).

(Step 7)

Next, polycrystalline 3C—SiC was deposited on the rugged surface of monocrystalline SiC layer 12 by the thermal CVD method involving feeding $SiCl_4$ at a flow rate of 200 sccm and $C_3H_8$ at a flow rate of 50 sccm and heating at a temperature of 1,320° C. The pressure was set at 15 Pa. By deposition treatment for 8 hours, polycrystalline SiC substrates 11, 11' of 840 μm thick were formed on the front and back surfaces of the monocrystalline SiC wafer (support substrate 21), i.e., the front surface of monocrystalline SiC layer 12 and the back surface of monocrystalline Si wafer as shown in FIG. 4(g).

(Step 8)

The laminate resulting from step (7) was then immersed in a mix solution of HF and $HNO_3$ for 120 hours whereupon the monocrystalline SiC wafer as support substrate 21 was selectively etched away and at the same time, polycrystalline SiC substrate 11' on the back side was separated. There was obtained an inventive SiC composite substrate 10 having the laminate structure of monocrystalline SiC layer 12 (4H—SiC (0001) Si plane)/polycrystalline SiC substrate 11 (cubic SiC of 840 μm thick) as shown in FIG. 4(h).

Figure 8:
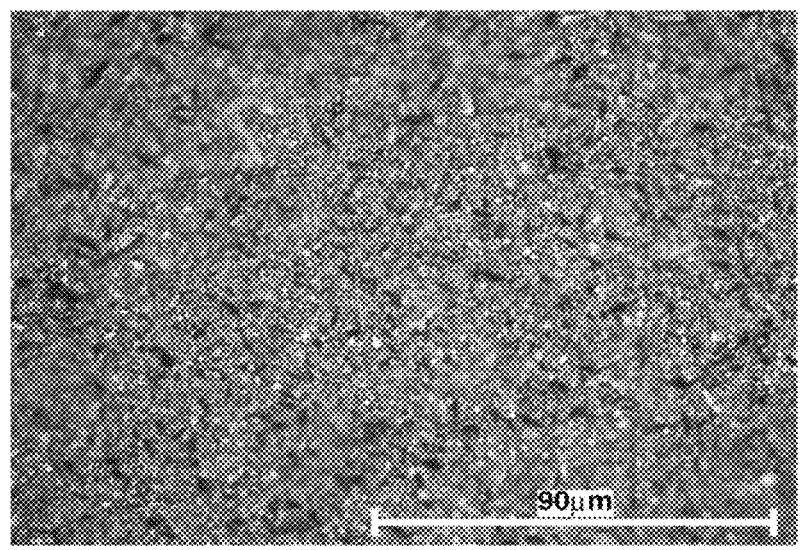
FIG. 8 is a stereomicroscope image of a front surface of a polycrystalline. SiC substrate in Example 1.

The surface of polycrystalline SiC substrate 11 in the resulting SiC composite substrate 10, that is, the surface of the deposited polycrystalline film (polycrystalline SiC substrate) was observed under a stereomicroscope, finding that the surface was granular as shown in FIG. 8, and consisted of a combination of irregular crystal grains having a particle size ranging from 0.1 μm to 1 μm.

Figure 9:
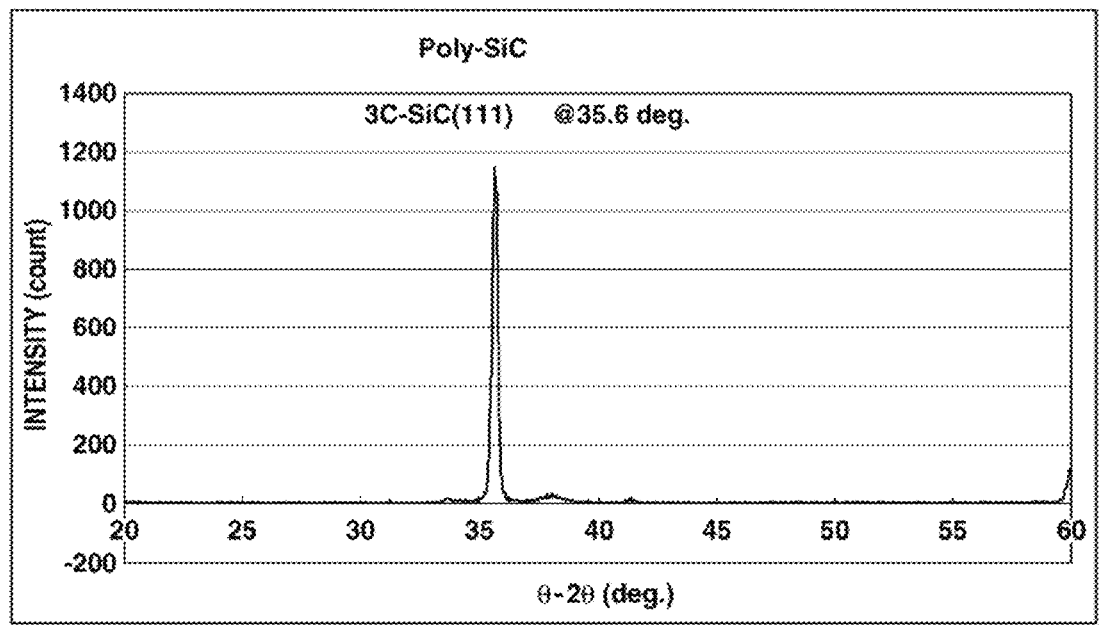
FIG. 9 is a diagram showing the data of a polycrystalline SiC substrate in an SiC composite substrate in Example 1 as analyzed by X-ray diffractometry (θ-2θ method).

The polycrystalline SiC substrate 11 was examined for crystallinity by the X-ray diffraction method (θ-2θ scan) using an X-ray diffractometer (SuperLab, Cu bulb, by Rigaku Corp.), finding that (111) face of 3C—SiC was a predominant lattice spacing of crystals of which the film was composed as shown in FIG. 9.

Further, by the X-ray rocking curve method (ω scan) using the X-ray diffractometer, a rocking curve was measured on (111) face of 3C—SiC crystals of which polycrystalline SiC substrate 11 is composed with reference to a normal axis to the surface of the monocrystalline SiC layer, the rocking curve being shown in FIG. 10. In FIG. 10, provided that the normal axis to the surface of the monocrystalline SiC layer 12 is the reference (ω=0°), the proportion of crystal grains meeting ω≤−2° or 2°≤ω was at least 65% of all crystal grains of polycrystalline SiC substrate 11. It is thus concluded that (111) faces of 3C—SiC crystals of which polycrystalline SiC substrate 11 is composed are randomly oriented with reference to a normal axis to the surface of monocrystalline SiC layer 12.

Since the orientation directions of crystal grains of polycrystalline SiC substrate 11 were randomly dispersed relative to the normal axis to the surface of monocrystalline SiC layer 12, the stress concentration in a particular direction was inhibited at the mismatch interface between polycrystalline SiC substrate 11 and monocrystalline SiC layer 12. The in-plane stress was equal to or less than 0.1 GPa, indicating that polycrystalline SiC substrate 11 and monocrystalline SiC layer 12 were tightly bonded. The stress within 4H—SiC (0001) plane of monocrystalline SiC layer 12 may be estimated from a peak shift of Raman scattering spectrum.

Further, a bowing (warpage) of the resulting SiC composite substrate 10 was measured to be less than 20 μm. This is estimated due to the internal stress reduction at the mismatch interface between polycrystalline SiC substrate 11 and monocrystalline SiC layer 12.

Notably, with respect to the warpage of SiC composite substrate 10, a bowing was measured by a Fizeau interferometer of vertical incident type (FlatMaster by Corning Tropel). In the SiC composite substrate 10 shown in FIG. 11, bowings b1 and b2 are measured as a difference in latitude between the center and one end of SiC composite substrate 10, and expressed in a minus value when a center portion of the substrate is downward convex as shown in FIG. 11(a) and in a plus value when a center portion of the substrate is upward convex as shown in FIG. 11(b). A warpage was measured on the SiC composite substrate 10 which was disposed with its monocrystalline SiC layer 12 facing upward (front surface side). The SiC composite substrate 10 was such that a center portion thereof was upward convex.

Understandably, although the invention has been described with reference to the embodiments shown in the figures, the invention is not limited to the illustrated embodiments. Other embodiments, further modifications, and changes may occur to persons skilled in the art, and all such embodiments are believed to be within the scope of the invention as long as equivalent effects and results are obtained.

REFERENCE SIGNS LIST

10 SiC composite substrate
11, 11' polycrystalline SiC substrate
11b grain boundary
11p, 12p lattice plane
12 monocrystalline SiC layer
12a monocrystalline SiC thin film
12e monocrystalline SiC thin film (heteroepitaxial growth film)
12i ion implanted region
12s monocrystalline SiC substrate
12' SiC epitaxial layer
13 bonded substrate
14, 14', 14" monocrystalline SiC thin film carrier
15, 15', 15" monocrystalline SiC layer carrier
16, 16' adhesively bonded assembly
21 support substrate
22 interposing layer
22a thin film
23 adhesive layer
$I_{12/11}$ mismatch interface

The invention claimed is:

1. A method for manufacturing an SiC composite substrate comprising a polycrystalline SiC substrate and a monocrystalline SiC layer thereon, comprising the steps of:
  forming a monocrystalline SiC thin film on one major surface of a support substrate,
  mechanically working the surface of the monocrystalline SiC thin film for roughening, and removing defects caused by mechanical working, to form a monocrystalline SiC layer having a surface which is more rugged than the surface of the layer adjacent to the support substrate, the rugged surface being composed of oblique surface segments which are randomly oriented with reference to a normal direction to the surface of the layer adjacent to the support substrate, depositing polycrystalline SiC on the rugged surface of the monocrystalline SiC layer by chemical vapor deposition, thereby forming a polycrystalline SiC substrate wherein the close-packed planes of polycrystalline SiC crystals are randomly oriented with reference to a normal direction to the surface of the monocrystalline SiC layer adjacent to the support substrate, and thereafter physically and/or chemically removing the support substrate.

2. The method of claim 1 wherein the step of working the surface of the monocrystalline SiC thin film for roughening includes polishing the surface of the monocrystalline SiC thin film in random directions with diamond abrasive grits.

3. The method of claim 1 wherein the support substrate is formed of polycrystalline or monocrystalline silicon.

4. The method of claim 1 wherein the step of forming a monocrystalline SiC thin film on a support substrate includes separating a monocrystalline SiC thin film from a monocrystalline SiC substrate by the ion implantation separation method and transferring the monocrystalline SiC thin film onto the support substrate.

5. The method of claim 1 wherein the step of forming a monocrystalline SiC thin film on a support substrate includes hetero-epitaxially growing SiC on the support substrate.

6. The method of claim 1 wherein a monocrystalline SiC layer carrier having the monocrystalline SiC layers on both surfaces of the support substrate is prepared, the polycrystalline SiC substrate is formed on the rugged surface of each monocrystalline SiC layer, and thereafter the support substrate is physically and/or chemically removed.

7. The method of claim 1 wherein a monocrystalline SiC layer carrier having the monocrystalline SiC layer only on the front surface of the support substrate is prepared, the polycrystalline SiC substrates are formed on the rugged surface of the monocrystalline SiC layer and the back surface of the support substrate, respectively, and thereafter the support substrate is physically and/or chemically removed.

8. The method of claim 1 wherein two monocrystalline SiC layer carriers are prepared, each carrier having the monocrystalline SiC layer only on the front surface of the support substrate, the back surfaces of the support substrates of the monocrystalline SiC layer carriers are bonded together, the polycrystalline SiC substrates are formed on the rugged surfaces of the monocrystalline SiC layers on the front and back surfaces of the bonded substrate, respectively, then the assembly is divided at the bonded interface between the back surfaces of the support substrates, and simultaneously or subsequently the support substrates are physically and/or chemically removed.

* * * * *